(12) United States Patent
Son et al.

(10) Patent No.: US 10,002,668 B2
(45) Date of Patent: *Jun. 19, 2018

(54) MEMORY DEVICE, MEMORY MODULE, AND MEMORY SYSTEM

(71) Applicant: SAMSUNG ELECTRONICS CO., LTD., Suwon-si, Gyeonggi-do (KR)

(72) Inventors: Jong-Pil Son, Seongnam-si (KR); Uk-Song Kang, Seongnam-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days. days.

This patent is subject to a terminal disclaimer.

(21) Appl. No.: 15/730,379

(22) Filed: Oct. 11, 2017

(65) Prior Publication Data

US 2018/0033489 A1 Feb. 1, 2018

Related U.S. Application Data

(63) Continuation of application No. 15/264,774, filed on Sep. 14, 2016, now Pat. No. 9,805,802.

(30) Foreign Application Priority Data

Sep. 14, 2015 (KR) .................. 10-2015-0129778
Jan. 22, 2016 (KR) .................. 10-2016-0008093

(51) Int. Cl.
*G11C 7/10* (2006.01)
*G11C 16/10* (2006.01)
*G06F 13/16* (2006.01)

(52) U.S. Cl.
CPC ............ *G11C 16/102* (2013.01); *G06F 13/16* (2013.01); *G06F 13/1673* (2013.01)

(58) Field of Classification Search
CPC .... G11C 16/102; G06F 13/16; G06F 13/1673
USPC ...................................... 365/189.02
See application file for complete search history.

(56) References Cited

U.S. PATENT DOCUMENTS

| | | | |
|---|---|---|---|
| 9,805,802 B2* | 10/2017 | Son | ............ G06F 13/16 |
| 2007/0011596 A1 | 1/2007 | Suh | |
| 2008/0147940 A1 | 6/2008 | Kao et al. | |
| 2011/0239021 A1 | 9/2011 | Vedder et al. | |
| 2017/0076768 A1 | 3/2017 | Son et al. | |

OTHER PUBLICATIONS

Office Action dated Mar. 9, 2017 in related U.S. Appl. No. 15/264,774.

* cited by examiner

*Primary Examiner* — Huan Hoang
(74) *Attorney, Agent, or Firm* — F. Chau & Associates, LLC

(57) ABSTRACT

A memory device includes a memory cell array, a data pattern providing unit, and a write circuit. The memory cell array includes a plurality of memory regions. The data pattern providing unit is configured to provide a predefined data pattern. The write circuit is configured to, when a first write command and an address signal are received from an external device, write the predefined data pattern provided from the data pattern providing unit to a memory region corresponding to the address signal.

27 Claims, 35 Drawing Sheets

FIG. 5A

| CLK | CMD Pins | | | | CA Pins (12) | | | | | | | | | | | |
|---|---|---|---|---|---|---|---|---|---|---|---|---|---|---|---|---|
| | /CS | /RAS | /CAS | /WE | CA0 | CA1 | CA2 | CA3 | CA4 | CA5 | CA6 | CA7 | CA8 | CA9 | CA10 | CA11 |
| R Edge | L | H | L | L | A0 | A1 | A2 | A3 | A4 | A5 | A6 | A7 | A8 | M0 | M1 | M2 |
| | Write (WCMD) | | | | Column ADDR | | | | | | | | | MCMD | | |

FIG. 5B

| CLK | CMD Pins | | | | CA Pins (6) | | | | | |
|---|---|---|---|---|---|---|---|---|---|---|
| | /CS | /RAS | /CAS | /WE | CA0 | CA1 | CA2 | CA3 | CA4 | CA5 |
| REdge1 | L | H | L | L | A0 | A1 | A2 | A3 | A4 | A5 |
| | Write(WCMD) | | | | Column ADDR | | | | | |
| REdge2 | — | | | | A6 | A7 | A8 | M0 | M1 | M2 |
| | | | | | Column ADDR (Cont.) | | | MCMD | | |

FIG. 6

| CAx | CAy | CAz | Write CMD | | Write Data | DQ |
|---|---|---|---|---|---|---|
| 0 | 0 | 0 | NW(Normal Write) | | Received Data | Used |
| 0 | 0 | 1 | PW (Pattern Write) | PW1 | All 0 | Not Used |
| 0 | 1 | 0 | | PW2 | All 1 | Not Used |
| 0 | 1 | 1 | | PW3 | Previously Written Data | Not Used |
| 1 | 0 | 0 | | PW4 | Buffer Data | Not Used |
| 1 | 0 | 1 | PS (Pattern Store) | | Received Data | Used |

FIG. 16

| CAx | CAy | CAz | CAj | CAk | CAl | Write CMD | Write Data |
|-----|-----|-----|-----|-----|-----|-----------|------------|
| 0 | 1 | 1 | 0 | 0 | 0 | | Previously 1 Written Data |
| 0 | 1 | 1 | 0 | 0 | 1 | | Previously 2 Written Data |
| 0 | 1 | 1 | 0 | 1 | 0 | PW3 (Pattern Write) | Previously 3 Written Data |
| | | ⋮ | | | | | ⋮ |
| 0 | 1 | 1 | 1 | 1 | 1 | | Previously 8 Written Data |

FIG. 22

| CAx | CAy | CAz | Write CMD | | Write Data | DQ |
|---|---|---|---|---|---|---|
| 0 | 0 | 0 | NW1(Normal Write) | | Received Data | Used |
| 0 | 0 | 1 | NW2 (Write PBUF & cell) | | Received Data | Used |
| 1 | 0 | 0 | PW (Pattern Write) | PW1 | Buffer Data 1 | Not Used |
| 1 | 0 | 1 | | PW2 | Buffer Data 2 | Not Used |
| 1 | 1 | 0 | | PW3 | Buffer Data 3 | Not Used |

MEMORY DEVICE, MEMORY MODULE, AND MEMORY SYSTEM

CROSS-REFERENCE TO RELATED APPLICATIONS

This application is a continuation application of U.S. patent application Ser. No. 15/264,774 filed Sep. 14, 2016, which claims priority under 35 U.S.C. § 119 to Korean Patent Application No. 10-2015-0129778, filed on Sep. 14, 2015, and Korean Patent Application No. 10-2016-0008093, filed on Jan. 22, 2016, in the Korean Intellectual Property Office, the disclosures of which are incorporated by reference herein in their entireties.

TECHNICAL FIELD

Exemplary embodiments of the inventive concept relate to a semiconductor memory device, and more particularly, to a memory device, a memory module, and a memory system capable of writing preset data to a memory cell array without using an input/output circuit when a write command is received.

DISCUSSION OF RELATED ART

Semiconductor memory devices, such as dynamic random-access memory (DRAM), are widely used as the main memory of computers, smart watches, smartphones, tablet computers, etc. Hardware has become more lightweight and powerful, and software has become more complicated. Demand for memory devices that have low power consumption and high processing speed has increased. Accordingly, various technologies for providing memory devices with these features have been developed.

SUMMARY

According to an exemplary embodiment of the inventive concept, a memory device includes a memory cell array including a plurality of memory regions, a data pattern providing unit configured to provide a predefined data pattern, and a write circuit configured to, when a first write command and an address signal are received from an external device, write the predefined data pattern provided from the data pattern providing unit to a memory region corresponding to the address signal.

According to an exemplary embodiment of the inventive concept, a memory module includes a first rank and a second rank configured to receive read or write commands, each of which comprises at least one memory device. The at least one memory device includes a memory cell array including a plurality of memory regions, a data pattern providing unit configured to provide a predefined data pattern, and a write circuit configured to, when a first write command and an address signal are received from an external device, write the predefined data pattern provided from the data pattern providing unit to a memory region corresponding to the address signal. The first rank and the second rank share a data bus. When the first rank receives the first write command synchronized to a first rising edge of a clock signal provided from the external device and performs a write operation in response to the first write command, the second rank is configured to receive one of the first write command, a second write command, or a read command synchronized to a second rising edge of the clock signal, which sequentially follows the first rising edge of the clock signal, and to perform a write operation or a read operation in response to the received command.

According to an exemplary embodiment of the inventive concept, a memory system includes a memory controller and a memory device. The memory controller is configured to compare input data that is input from an external source to a predefined data pattern, and when the input data matches the predefined data pattern, to transmit a pattern write command and address information. The memory device configured to internally output the predefined data pattern in response to the pattern write command and write the predefined data pattern to a memory region corresponding to the address information.

According to an exemplary embodiment of the inventive concept, a method of writing data in a memory system including a memory device and a memory controller includes defining a predefined data pattern, receiving a pattern write command and a first address signal from the memory controller, generating the predefined data pattern in response to the pattern write command, and writing the predefined data pattern to a memory region corresponding to the first address signal.

BRIEF DESCRIPTION OF THE DRAWINGS

The above and other features of the inventive concept will become apparent and more clearly understood by describing in detail exemplary embodiments thereof with reference to the accompanying drawings.

FIGS. 5A and 5B are diagrams for describing a method of setting a write command according to exemplary embodiments of the inventive concept.

FIG. 6 is a table showing an example of different settings for a write command, according to an exemplary embodiment of the inventive concept.

FIG. 16 is a table showing an example of setting a write command, according to an exemplary embodiment of the inventive concept.

FIG. 22 is a table showing an example of different settings for a write command, according to an exemplary embodiment of the inventive concept.

DETAILED DESCRIPTION OF THE EMBODIMENTS

Figure 1:
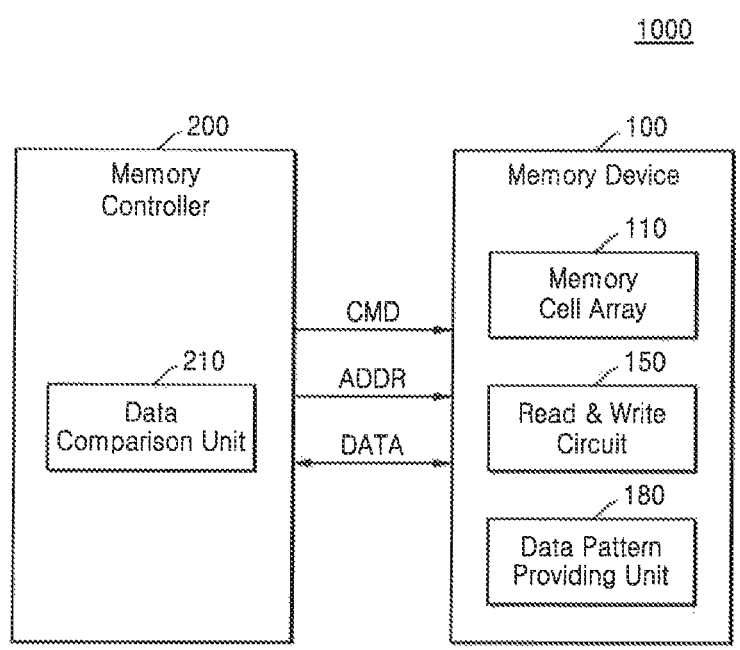
FIG. 1 is a block diagram of a memory system according to an exemplary embodiment of the inventive concept.

Exemplary embodiments of the inventive concept will be described more fully hereinafter with reference to the accompanying drawings. Like reference numerals may refer to like elements throughout the accompanying drawings.

Exemplary embodiments of the inventive concept provide a memory device capable of reducing power consumed by an input/output (I/O) circuit, as well as a memory module and a memory system with low power consumption and high processing speed.

FIG. 1 is a block diagram of a memory system 1000 according to an exemplary embodiment of the inventive concept.

Referring to FIG. 1, the memory system 1000 may include a memory controller 200 and a memory device 100. The memory controller 200 may include a data comparison unit 210. The memory device 100 may include a memory cell array 110, a read and write circuit 150, and a data pattern providing unit 180.

The memory controller 200 may provide various signals for controlling the memory device 100. For example, the memory controller 200 may provide a command CMD and an address signal ADDR to the memory device 100. The memory controller 200 may transmit and receive data DATA to and from the memory device 100.

Based on the signals received from the memory controller 200, the memory device 100 may store data in the memory cell array 110 or provide the data stored in the memory cell array 110 to the memory controller 200.

When writing data to the memory device 100, the memory controller 200 may transmit, to the memory device 100, a write command, the address signal ADDR indicating a memory region to write the data, and the data to be written. According to an exemplary embodiment of the inventive concept, when the data to be written to the memory device 100 matches a predefined data pattern, the memory controller 200 may not provide data to the memory device 100 and instead, provide the command CMD to write the predefined data pattern (e.g., a pattern write command) and the address signal ADDR to the memory device 100.

The predefined data pattern may be data identically defined in the memory controller 200 and the memory device 100. In other words, the predefined data pattern may be data determined in advance between the memory controller 200 and the memory device 100. For example, the data pattern may be data having consecutive bits of '0' or '1.' Alternatively, the data pattern may be data previously provided to the memory device 100 as write data. Alternatively, the data pattern may be data defined by a user (hereinafter, referred to as 'user defined data'). The user defined data may refer to a data pattern defined by a host during an operation of the memory device 100 or the memory system 1000. Alternatively, the data pattern may be data frequently written to the memory device 100. Alternatively, the data pattern may be data defined during operations of the memory device 100 and the memory system 1000.

As described above, the memory controller 200 may provide the command CMD for writing the predefined data pattern (e.g., a pattern write command) and the address signal ADDR to the memory device 100. In this case, the memory device 100 may internally generate a data pattern or select one of a plurality of prestored data patterns, and write the data pattern to the memory cell array 110.

As described above, the memory controller 200 may include the data comparison unit 210. When the data comparison unit 210 receives a write request from an external device, e.g., a host, the data comparison unit 210 may compare the data that is requested to be written with a predefined data pattern, and determine a matching degree. When the data requested to be written matches the predefined data pattern (e.g., the matching degree is sufficiently high), the memory controller 200 may transmit the pattern write command and the address signal ADDR to the memory device 100. When the data requested to be written does not match the predefined data pattern, the memory controller 200 may transmit a normal write command, the address signal ADDR, and the data to the memory device 100. The data may be transmitted via a data bus for transmitting data between the memory controller 200 and the memory device 100.

The memory device 100 may include a random-access memory (RAM) cell that requires high processing speed. The memory device 100 may include a dynamic random-access memory (DRAM) cell as the RAM cell. The memory device 100 may be a DRAM chip including the DRAM cell. Alternatively, the memory device 100 may include other types of RAM cells, such as a magnetic RAM (MRAM) cell, a spin transfer torque magnetic RAM (STT-MRAM) cell, a phase change RAM (PRAM) cell, a resistive RAM (RRAM) cell, or the like.

The memory cell array 110 may include a plurality of memory regions including a plurality of memory cells. As described above, the memory cells may include DRAM cells or other types of RAM cells. Alternatively, the memory cells may be single level cells that store single-bit data or multi-level cells that store at least two bits of data.

The data pattern providing unit 180 may generate the predefined data pattern and provide the predefined data pattern to the read and write circuit 150. According to an exemplary embodiment of the inventive concept, the data pattern providing unit 180 may generate the predefined data pattern in response to the pattern write command from the memory controller 200.

The read and write circuit 150 may write or read data to or from the memory cell array 110. The read and write circuit 150 may write data to a memory region corresponding to the address signal ADDR received from the memory controller 200 or may read data from the memory region. According to an exemplary embodiment of the inventive concept, when the pattern write command and the address signal ADDR are received from the memory controller 200, the read and write circuit 150 may write the predefined data pattern provided from the data pattern providing unit 180 to the memory region corresponding to the address signal ADDR.

In the memory system 1000 according to the present exemplary embodiment, when data requested to be written to the memory device 100 matches the predefined data pattern, without transmitting this data, the memory controller 200 may provide the pattern write command and the address signal ADDR to the memory device 100. As such, the memory device 100 may not receive the data from the memory controller 200. Instead, the memory device 100 may write, to the memory cell array 110, a data pattern selected in response to the pattern write command from among a plurality of data patterns internally generated based on the pattern write command or a stored data pattern. Accordingly, since there is no data transmission between the memory controller 200 and the memory device 100, power consumption of the memory system 1000 may be reduced. Also, when the memory system 1000 performs a write operation, since data transmission time between the memory controller 200 and the memory device 100 decreases, operation speed of the memory system 1000 may increase.

Figure 2:
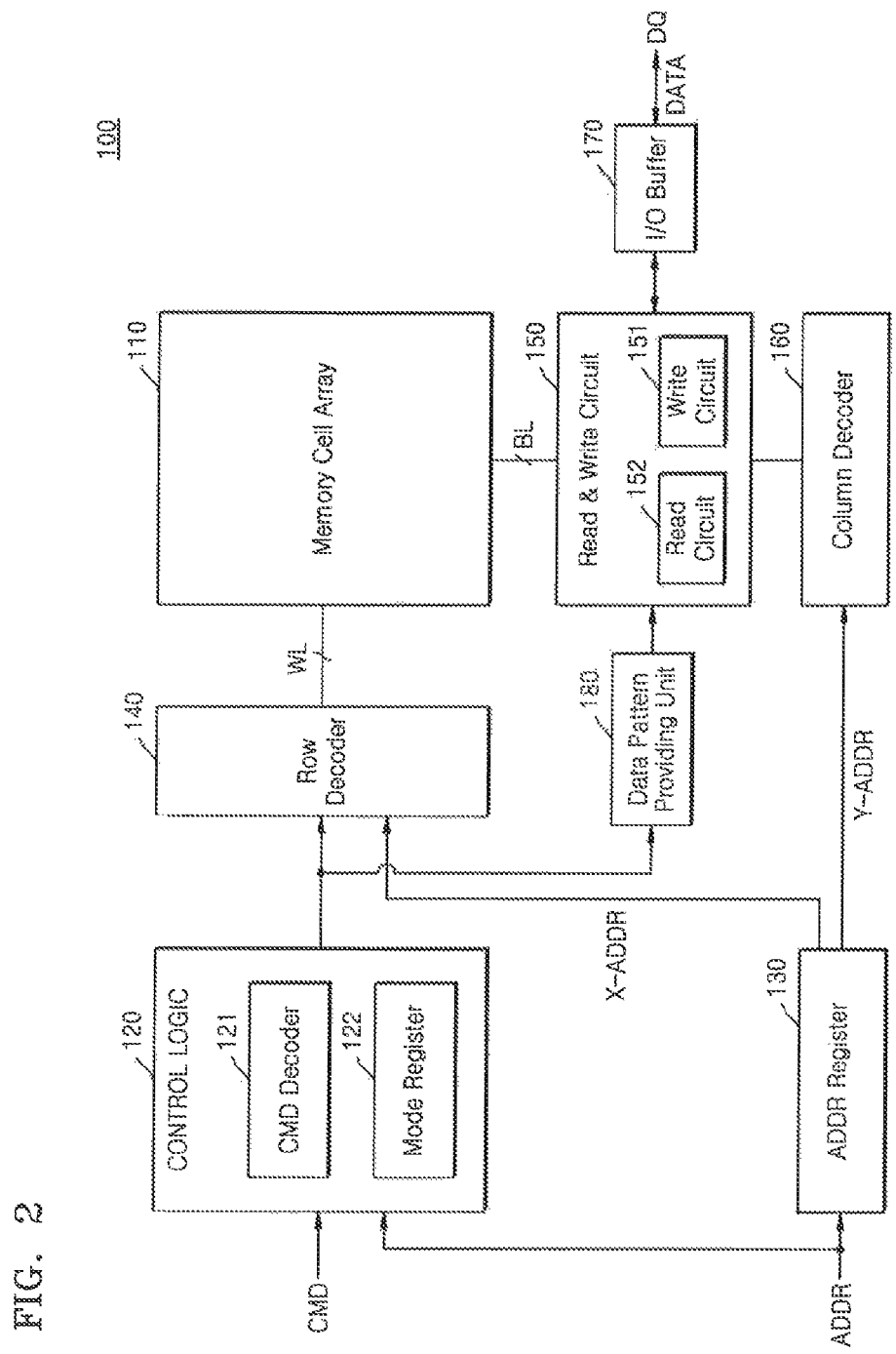
FIG. 2 is a schematic block diagram of a memory device according to an exemplary embodiment of the inventive concept.

FIG. 2 is a schematic block diagram of the memory device 100 according to an exemplary embodiment of the inventive concept.

Referring to FIG. 2, the memory device 100 may include the memory cell array 110, a control logic 120, an address register 130, a row decoder 140, a column decoder 160, the read and write circuit 150, an input/output (I/O) buffer 170, and the data pattern providing unit 180. In addition, the memory device 100 may further include various types of circuits for data write and read operations.

The memory cell array 110 may include the plurality of memory cells arranged in an area where a plurality of bit lines BL intersects a plurality of word lines WL. The plurality of memory cells may form a memory region. The memory region may include write units of memory cells.

The control logic 120 may include a command decoder 121 and a mode register 122, and may control overall operations of the memory device 100. The command decoder 121 may decode signals related to the command CMD applied from an external source, e.g., a chip select signal (/CS), a row address strobe signal (/RAS), a column address strobe signal (/CAS), a write enable signal (/WE), or a clock enable signal (CKE), and may internally generate decoded command signals. According to an exemplary embodiment of the inventive concept, the control logic 120 may also decode the address signal ADDR and generate control signals related to a write command. The mode register 122 may set an internal register, in response to the address signal ADDR and a mode register signal, to determine an operation mode of the memory device 100.

The address register 130 may temporarily store the address signal ADDR that is input by the external source. The address register 130 may transmit a row address X-ADDR to the row decoder 140 and a column address Y-ADDR to the column decoder 160.

Each of the row decoder 140 and the column decoder 160 may include a plurality of switches. The row decoder 140 may select the word line WL in response to the row address X-ADDR, and the column decoder 160 may select the bit line BL in response to the column address Y-ADDR.

The I/O buffer 170 may provide data DATA, read from the memory cell array 110, to a device outside the memory device 100, e.g., the memory controller 200 of FIG. 1, or provide data DATA received from the external source to the read and write circuit 150. The data DATA may be transmitted to or received from an external device via data pads (DQ) (or a data pin).

The data pattern providing unit 180 may provide the predefined data pattern to the read and write circuit 150. The data pattern providing unit 180 may generate the predefined data pattern in response to the pattern write command received from the external source, e.g., the memory controller 200. According to an exemplary embodiment of the inventive concept, in response to the pattern write command, the data pattern providing unit 180 may select one of a plurality of predefined data patterns and output the selected predefined data pattern. For example, the data pattern providing unit 180 may select a data pattern corresponding to the pattern write command from a pattern buffer storing the plurality of predefined data patterns, and output the selected data pattern.

The read and write circuit 150 may include a write circuit 151 and a read circuit 152, and write or read data to or from the memory cell array 110. For example, the write circuit 151 may include a plurality of write drivers, and the read circuit 152 may include a plurality of sense amplifiers.

The write circuit 151 may selectively write, to the memory cell array 110, one of data provided from the I/O buffer 170 (received from the external source) or the predefined data pattern provided from the data pattern providing unit 180. When the normal write command is received from the external source, the write circuit 151 may write the data provided from the I/O buffer 170 to the memory cell array 110. When the pattern write command is received from the external source, the write circuit 151 may write the predefined data pattern provided from the data pattern providing unit 180 to the memory cell array 110.

Accordingly, when the pattern write command and the address signal ADDR are received from the memory controller 200, the memory device 100 may write the predefined data pattern to the memory region corresponding to the address signal ADDR. Thus, since data is not received from the external source when writing the predefined data pattern, power consumption of the memory device 100 may be reduced. Also, although data is normally transmitted from the memory controller 200 via the data bus, since data transmission does not occur between the memory controller 200 and the memory device 100 when writing the predefined data pattern, the data bus is not used, and thus, the data bus may be occupied for a short time. In this case, data bus utilization may be increased because the data bus may be used for other operations of the memory device 100 (e.g., a read operation and a sequentially performed write operation, etc.) or operations of another memory device.

Figure 3:
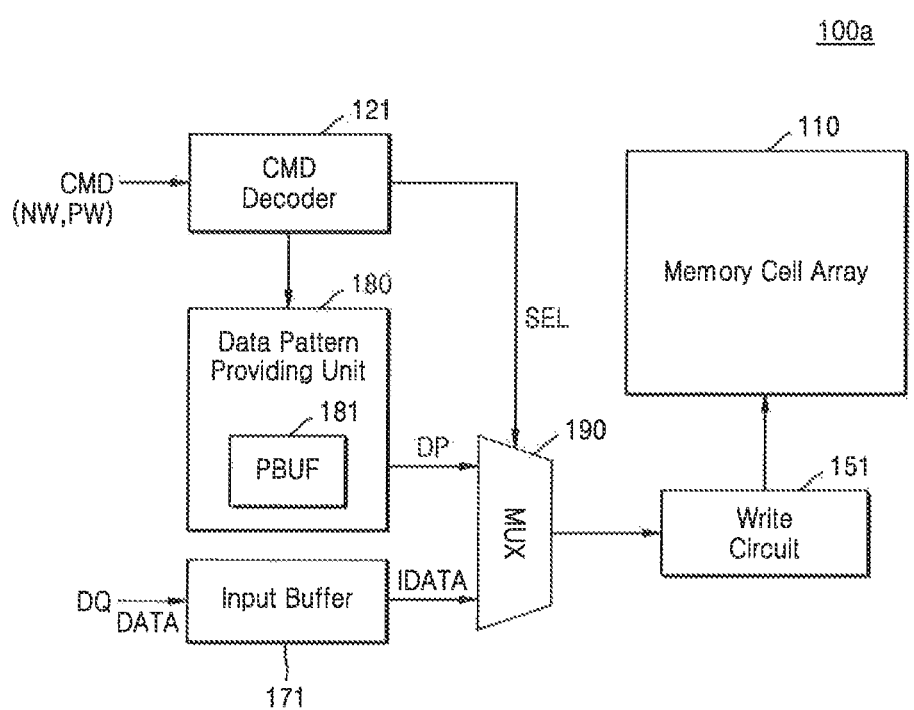
FIG. 3 is a block diagram of an example of a memory device, according to an exemplary embodiment of the inventive concept.

FIG. 3 is a block diagram of an example of a memory device 100*a*, according to an exemplary embodiment of the inventive concept. FIG. 3 shows the main components of the memory device 100*a* related to a write operation. Components of the memory device 100 shown in FIG. 2 may also be included in the memory device 100*a* shown in FIG. 3. The write operation of the memory device 100*a* will be described below with reference to FIG. 3.

Referring to FIG. 3, the memory device 100*a* may include the memory cell array 110, the command decoder 121, the write circuit 151, an input buffer 171, the data pattern providing unit 180, and a multiplexer 190.

The command decoder 121 may decode the command CMD related to the write operation received from the external source, e.g., the memory controller 200 of FIG. 1, and may generate control signals for controlling operations of the data pattern providing unit 180 and the multiplexer 190. During the write operation, the command decoder 121 may receive one of a normal write command NW or a pattern write command PW. Accordingly, the command decoder 121 may control the operations of the data pattern providing unit 180 and the multiplexer 190 based on the normal write command NW or the pattern write command PW.

The data pattern providing unit 180 may output the predefined data pattern in response to the pattern write command PW. According to an exemplary embodiment of the inventive concept, in response to the pattern write command PW, the data pattern providing unit 180 may selectively generate one of the plurality of predefined data patterns. For example, when the predefined data patterns are data with an identical bit value, e.g., data having consecutive bits of '0' or '1,' the data pattern providing unit 180 may generate a data pattern in which an identical bit value is continuously repeated, in response to the pattern write command PW. According to exemplary embodiments of the inventive concept, the data pattern providing unit 180 may include a pattern buffer 181 that stores the plurality of predefined data patterns, and in response to the pattern write command PW, the data pattern providing unit 180 may output one of the plurality of predefined data patterns stored in the pattern buffer 181.

The input buffer 171 is an element of the I/O buffer 170 of FIG. 2, and may receive data DATA from the external source via the data pad DQ. The input buffer 171 may temporarily store the data and provide the data to the write circuit 151.

Based on a selection signal SEL, the multiplexer 190 may output, to the write circuit 151, one of a data pattern DP output from the data pattern providing unit 180 or input data IDATA output from the input buffer 171. The multiplexer 190 may selectively output the data pattern DP or the input data IDATA, in response to the selection signal SEL that has a different level according to the pattern write command PW or the normal write command NW. For example, when the normal write command NW is received, the selection signal SEL may have a first level, e.g., logic high, and when the pattern write command PW is received, the selection signal SEL may have a second level, e.g., logic low. The multiplexer 190 may output the input data IDATA in response to the selection signal SEL having the first level, and output the data pattern DP in response to the selection signal SEL having the second level.

The write circuit 151 may write data output from the multiplexer 190 to a memory region of the memory cell array 110 corresponding to the address signal ADDR.

When a normal write operation is performed, the memory device 100*a* may receive the normal write command NW, the address signal ADDR, and data from the external source, e.g., the memory controller 200 of FIG. 1. In this case, the data pattern providing unit 180 does not output the data pattern DP. The multiplexer 190 may provide the data, received from the external source through the input buffer 171, to the write circuit 151. The write circuit 151 may write the data to the memory region of the memory cell array 110 corresponding to the address signal ADDR.

When a pattern writing operation is performed, the memory device 100*a* may receive the pattern write command PW and the address signal ADDR from the external source, e.g., the memory controller 200 of FIG. 1. The data pattern providing unit 180 may output the data pattern DP in response to the pattern write command PW. In this case, data is not received from the external source. The multiplexer 190 may provide the data pattern DP, output from the data pattern providing unit 180, to the write circuit 151. The write circuit 151 may write the data pattern DP to the memory region of the memory cell array 110 corresponding to the address signal ADDR.

Figure 4:
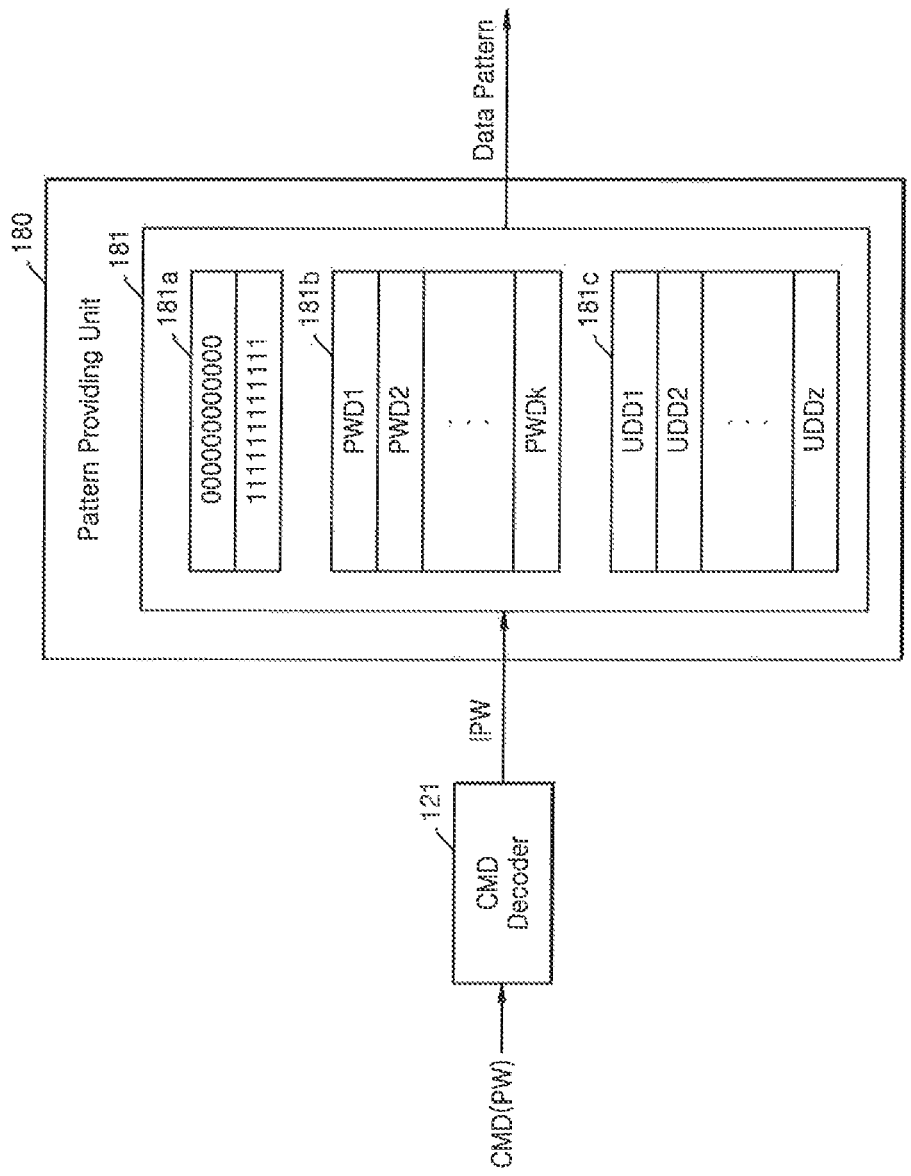
FIG. 4 is a diagram of an example of a data pattern providing unit of FIG. 3, according to an exemplary embodiment of the inventive concept.

FIG. 4 is a diagram of an example of the data pattern providing unit 180 of FIG. 3 according to an exemplary embodiment of the inventive concept.

Referring to FIG. 4, the data pattern providing unit 180 may include the pattern buffer 181. The pattern buffer 181 may store at least one predefined data pattern. According to exemplary embodiments of the inventive concept, the data pattern may include data 181*a* having consecutive bits of '0' or '1.' For example, the data pattern may be data having all bits of '0' or '1.'

According to exemplary embodiments of the inventive concept, the data pattern may include data 181*b* previously written to the memory cell array 110 of FIG. 3. The data 181*b* may be received together with the normal write command NW from the memory controller 200 of FIG. 1 and written to the memory cell array 110 of FIG. 1. According to an exemplary embodiment of the inventive concept, the data pattern may include a plurality of previous written data PWD1 to PWDk.

According to exemplary embodiments of the inventive concept, the data pattern may include buffer data 181*c* requested to be written to the pattern buffer 181 from the memory controller 200 of FIG. 1. In an exemplary embodiment of the inventive concept, the buffer data 181*c* may include a plurality of buffer data UDD1 to UDDz that the memory controller 200 requested to store in the pattern buffer 181. For example, the buffer data may include a user-defined data pattern or a data pattern frequently written to the memory device 100.

According to exemplary embodiments of the inventive concept, the pattern buffer 181 may store at least one of the aforementioned data patterns. However, the aforementioned data patterns are merely exemplary, and the pattern buffer 181 may store data patterns other than the aforementioned data patterns.

The data pattern providing unit 180 may output one of the data patterns stored in the pattern buffer 181 in response to an internal pattern write control signal IPW generated by decoding the pattern write command PW. According to an exemplary embodiment of the inventive concept, the data pattern providing unit 180 may expand a selected data pattern and generate a new data pattern. For example, when a memory region requested to be written to has a capacity of 64 bytes and a selected data pattern is a 32-byte data pattern, the data pattern providing unit 180 may generate a data pattern in which the selected data pattern is repeated twice and output the generated data pattern having 64 bytes.

FIGS. 5A and 5B are diagrams for describing a method of setting a write command according to exemplary embodiments of the inventive concept.

Referring to FIGS. 5A and 5B, a type of the write command is set based on a combination of a general write command WCMD indicating write instructions and a write mode command MCMD indicating a write mode. In the normal write command NW and the pattern write command PW, the general write command WCMD may be identically set but the write mode command MCMD may be differently set. Therefore, the normal write command NW and the pattern write command PW may be distinguished from one another according to a set value of the write mode command MCMD.

The general write command WCMD may be set based on a chip select signal (/CS), a row address strobe signal (/RAS), a column address strobe signal (/CAS), and a write enable signal (/WE) that are received via command pins (or a command pad) of the memory device 100. For example, the general write command WCMD may be set when the chip select signal (/CS) has a low level, the row address strobe signal (/RAS) has a high level, and the column address strobe signal (/CAS) and the write enable signal (/WE) each have a low level. The general write command WCMD may be synchronized with a rising edge (R edge) of a clock signal CLK and then received. However, the general write command WCMD is not limited thereto. The general write command WCMD (or other signals) may be synchronized with at least one of a rising edge or a falling edge of the clock signal CLK. However, for convenience of description, hereinafter, it will be assumed that signals are synchronized with the rising edge (R edge) of the clock signal CLK.

The write mode command MCMD may be set based on signals received via address pins (CA pins) of the memory device 100. Referring to FIG. 5A, the memory device 100 includes twelve address pins (CA[11:0]). Address signals (A0 to A8), e.g., column address signals, may be received via nine address pins (CA[8:0]), and the write mode command MCMD may be received via the remaining three address pins (CA[11:9]). The normal write command or the pattern write command may be set based on a set value of mode signals M0, M1, and M2 received via the address pins (CA[11:9]).

Referring to FIG. 5B, the memory device 100 includes six address pins (CA[5:0]), and receives, via the six address pins, an address signal (e.g., the column address signal) and the write mode command MCMD that are synchronized with two rising edges of the clock signal CLK (REdge1 and REdge2). Similar to FIG. 5A, to set the write mode command WCMD, the chip select signal (/CS), the row address strobe signal (/RAS), the column address strobe signal (/CAS), and the write enable signal (/WE) may be synchronized with a first rising edge REdge1 of the clock signal CLK and received via the command pins. First to sixth address signals A0 to A5 may be synchronized with the first rising edge REdge1 of the clock signal CLK and received via six address pins (CA[5:0]). Also, sixth to ninth address signals A6 to A8 may be synchronized with a second rising edge REdge2 of the clock signal CLK and received via three address pins (CA[2:0]). The mode signals M0, M1, and M2 may be received via the remaining three address pins (CA[5:3]).

FIG. 6 is a table of an example of different settings for a write command, according to an exemplary embodiment of the inventive concept.

As described above with reference to FIGS. 5A and 5B, the write command may be set based on the general write command WCMD and the write mode command MCMD. The write mode command MCMD may be transmitted via address pins (or an address pad) of the memory device 100. These address pins are not used for transmitting address signals, e.g., address pins CAx, CAy, and CAz.

Referring to FIG. 6, the normal write command NW is set when a mode signal '0 0 0' is received via the address pins CAx, CAy, and CAz, and the pattern write command PW is set in other cases. In response to the normal write command NW, the memory device 100 of FIG. 1 may write data received from the memory controller 200 to the memory cell array 110. In this case, since the memory device 100 receives data, the data pad DQ of FIG. 2 may be used. The data pad DQ includes a plurality of pads.

According to an exemplary embodiment of the inventive concept, in response to the normal write command NW, the memory device 100 of FIG. 1 may store the data received from the memory controller 200 in not only the memory cell array 110 but also the pattern buffer 181.

In response to the pattern write command PW, the memory device 100 of FIG. 1 may write an internally predefined data pattern to the memory cell array 110, as described above. In this case, since the memory device 100 does not receive data, the data pad DQ is not used.

Based on values set for signals received via the address pins CAx, CAy, and CAz, one of a plurality of pattern write commands PW1, PW2, PW3, and PW4 may be set. For example, when the mode signal received via the address pins CAx, CAy, and CAz is '0 0 1' or '0 1 0,' a first pattern write command PW1 or a second pattern write command PW2 may be set, respectively. In response to the first pattern write command PW1 or the second pattern write command PW2, the memory device 100 may write a data pattern, in which all bits are set to '0' or '1', to the memory cell array 110. As another example, a third pattern write command PW3 may be set when the mode signal received via the address pins CAx, CAy, and CAz is '0 1 1,' and a fourth pattern write command PW4 may be set when the mode signal is '1 0 0.' In response to the third pattern write command PW3, the memory device 100 may write previously written data to the memory cell array 110 as a data pattern. Also, in response to the fourth pattern write command PW4, the memory device 100 may write buffer data to the memory cell array 110. As described above with reference to FIG. 4, the buffer data is a data pattern, requested by the memory controller 200 of FIG. 1, to be written and stored in the pattern buffer 181. The buffer data may include a user-defined data pattern or a data pattern that is frequently written to the memory device 100.

In order to store the buffer data in the pattern buffer 181 of the memory device 100, the memory controller 200 may transmit a pattern store command PS and data (e.g., the buffer data) to the memory device 100. The pattern store command PS is an instruction to write the buffer data to the pattern buffer 181. When the memory device 100 receives the pattern store command PS, the memory device 100 may store the buffer data, received via the data pad DQ, in the pattern buffer 181. The pattern store command PS may be provided as one of the write commands. For example, as shown in FIG. 6, the pattern store command PS may be set when the mode signal received via the address pins CAx, CAy, and CAz is '1 0 1'.

Heretofore, an example of setting the write command has been described with reference to FIG. 6. However, the inventive concept is not limited thereto, and signals indicating the normal write command and the pattern write command may be set in various manners.

Figure 7:
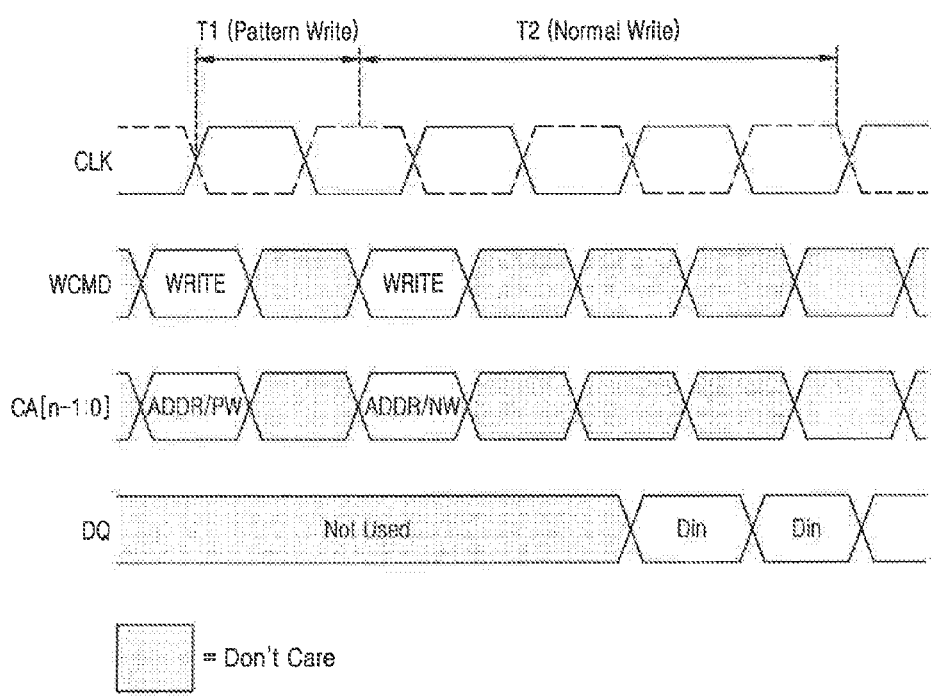
FIG. 7 is a timing diagram of an input signal of a memory device during a write operation, according to an exemplary embodiment of the inventive concept.

FIG. 7 is a timing diagram of an input signal of a memory device during a write operation, according to an exemplary embodiment of the inventive concept.

Referring to FIG. 7, during the write operation, a command instructing the write operation (e.g., the general write command WCMD of FIGS. 5A and 5B), the address signal ADDR, and the write commands PW and NW are synchronized with the rising edge of the clock signal CLK and received. The write commands PW and NW may be received via some of the address pins (CA[n−1:0]). When the pattern write command PW is received, data is not received. When the normal write command NW is received, data (Din) may be received from the external source, e.g., the memory controller 200 of FIG. 1. The data (Din) may be received during a certain period of time after the normal write command NW is received. As shown in FIG. 7, since data is not received with the pattern write command PW, time does not need to be allocated for receiving the data (Din) during a first time period T1 of the pattern write command PW. Therefore, the pattern write command PW may be performed during a relatively short period of time. Also, since data is not received, power consumption by the memory device due to data reception may decrease.

In FIG. 7, during the write operation, the address signal ADDR corresponding to a memory region is transmitted. However, the inventive concept is not limited thereto. For example, the address signal ADDR, transmitted during the write operation, may correspond to a plurality of memory regions, which will be described below with reference to FIG. 8.

Figure 8:
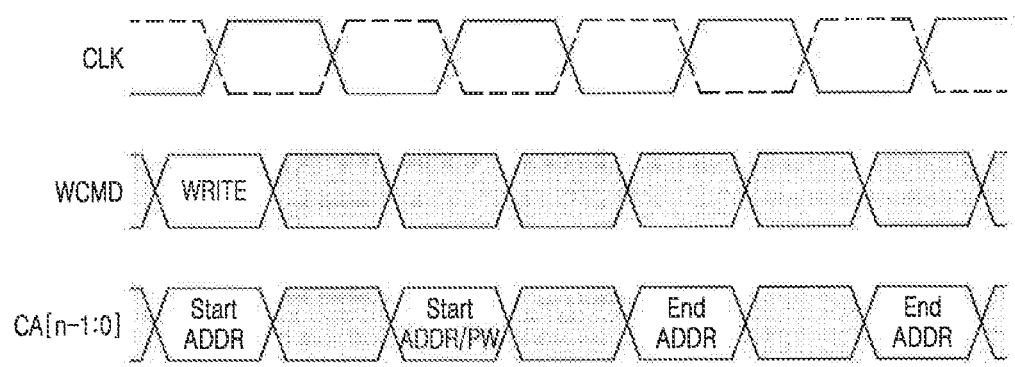
FIG. 8 is a timing diagram of an example of setting an address during a write operation, according to an exemplary embodiment of the inventive concept.

FIG. 8 is a timing diagram of an example of setting an address during a write operation, according to an exemplary embodiment of the inventive concept.

Referring to FIG. 8, during the write operation, the memory device 100 receives a start address signal (Start ADDR) and an end address signal (End ADDR). The start address signal (Start ADDR) indicates a start point and the end address signal (End ADDR) indicates an end point at which data is stored in the memory cell array 110 of FIG. 1. Address signals may be synchronized with two rising edges of the clock signal CLK and transmitted. For example, the start address signal (Start ADDR) may be synchronized with first and second rising edges of the clock signal CLK and received. According to an exemplary embodiment of the inventive concept, as described above with reference to FIG. 5B, the pattern write command PW may be received together with the address signal. The pattern write command PW may be synchronized with the second rising edge of the clock signal CLK and received together with the start address signal (Start ADDR). Then, the pattern write command PW may be synchronized with subsequent rising edges of the clock signal CLK, e.g., a third rising edge and fourth rising edge, and the end address signal (End ADDR) may be received. The memory device 100 may write data patterns to a plurality of memory regions corresponding to the start address signal (Start ADDR) and the end address signal (End ADDR).

According to an exemplary embodiment of the inventive concept, after the start address signal (Start ADDR) and the pattern write command PW are received, length information may be synchronized with the third rising edge and received. The length information may include information corresponding to a length of a memory region in which the data pattern is to be written. The memory device 100 may write an internally generated data pattern from a memory region corresponding to the start address signal (Start ADDR) to a memory region that is defined based on the length information.

Figure 9:
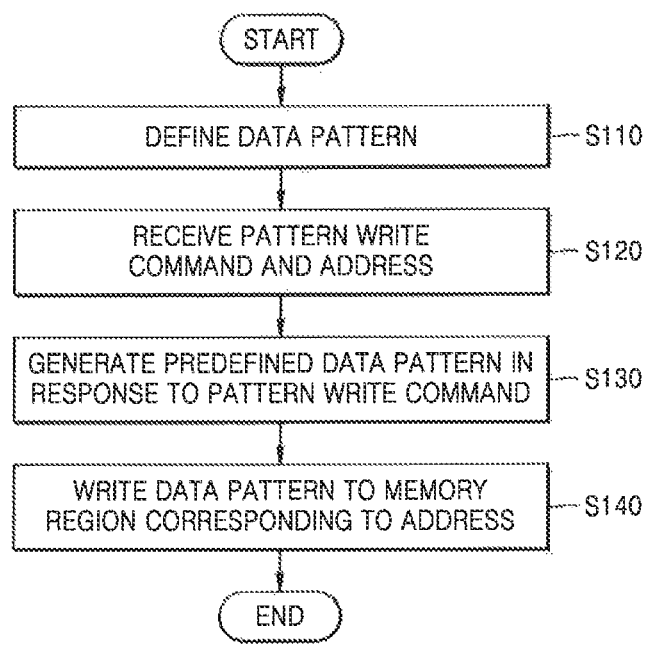
FIG. 9 is a flowchart of a writing method performed by a memory device, according to an exemplary embodiment of the inventive concept.

FIG. 9 is a flowchart of a writing method performed by a memory device, according to an exemplary embodiment of the inventive concept.

Referring to FIG. 9, the memory device 100 may define a data pattern (S110). The data pattern may be data determined in advance between the memory controller 200 and the memory device 100. For example, the data pattern may be data having consecutive bits of '0' or '1.' Alternatively, the data pattern may be data previously provided to the memory device 100 as write data. Alternatively, the data pattern may be user defined data or data frequently written to the memory device 100. Alternatively, the data pattern may be data defined during operations of the memory device 100 and the memory system 1000. The memory device 100 may store the data pattern in an internal buffer, e.g., the pattern buffer 181 of FIG. 3.

A pattern write command and an address signal are received from the memory controller 200 (S120). In response to the pattern write command, the memory device 100 may generate the data pattern, e.g., a predefined data pattern (S130). The memory device 100 may select a data pattern corresponding to the pattern write command from the pattern buffer 181. The memory device 100 may output the selected data pattern, or expand the selected data pattern and generate a new data pattern to be output.

The memory device 100 may write the data pattern to a memory region corresponding to the received address signal (S140).

Accordingly, when the pattern write command is received from the memory controller 200, the memory device 100 may internally generate the predefined data pattern and write the predefined data pattern to the memory cell array 110. Thus, a write operation may be performed without receiving additional data from the memory controller 200.

Figure 10:
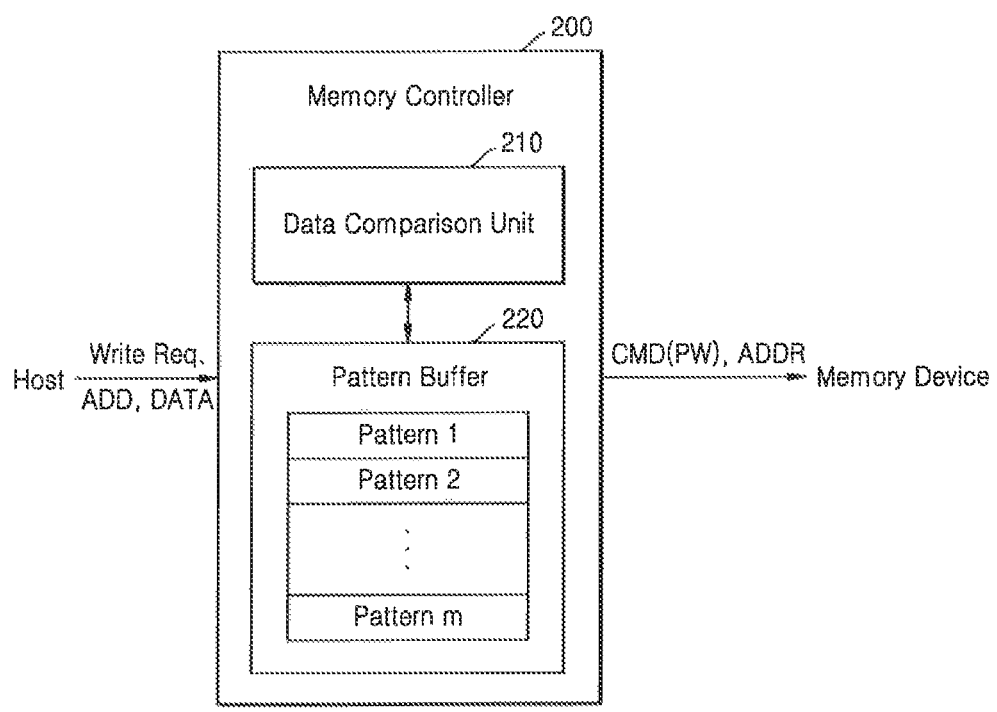
FIG. 10 is a block diagram of an example of a memory controller, according to an exemplary embodiment of the inventive concept.

FIG. 10 is a block diagram of an example of the memory controller 200, according to an exemplary embodiment of the inventive concept.

Referring to FIG. 10, the memory controller 200 may include the data comparison unit 210 and a pattern buffer 220. According to an exemplary embodiment of the inventive concept, the pattern buffer 220 may be provided as a functional block in the same manner as the data comparison unit 210. According to an exemplary embodiment of the inventive concept, a portion of a buffer included in the memory controller 200 may be used as the pattern buffer 220.

The predefined data pattern may be stored in the pattern buffer 220. According to an exemplary embodiment of the inventive concept, a plurality of data patterns Pattern 1 to Pattern m may be stored in the pattern buffer 220. The plurality of data patterns may be substantially the same as the plurality of data patterns (e.g., 181*a*, 181*b*, and 181*c* of FIG. 4) stored in the pattern buffer 181 of the data pattern providing unit 180 of the memory device 100*a* of FIG. 3. According to exemplary embodiments of the inventive concept, the plurality of data patterns may include data having bits of '0' or '1', write data previously transmitted to the memory device 100, or data provided from a host as user defined data.

When a write request, address information ADD, and data DATA are received from the host, the data comparison unit 210 may compare the data DATA with the data pattern stored in the pattern buffer 220. According to an exemplary embodiment of the inventive concept, the data comparison unit 210 may compare the data DATA with the plurality of data patterns Pattern 1 to Pattern m. When the data DATA matches a data pattern among the plurality of data patterns, the memory controller 200 may generate the pattern write command PW corresponding to the matching data pattern. A detailed description will be omitted since it has already been described with reference to FIG. 6.

The memory controller 200 may transmit the pattern write command PW and the address signal ADDR to the memory device 100. In this case, the address signal ADDR indicates a memory region of the memory device 100 corresponding to the address information ADD received from the host.

When the data DATA does not match the data pattern, the memory controller 200 may generate the normal write command NW. The memory controller 200 may transmit the normal write command NW, the address signal ADDR, and the data DATA to the memory device 100.

Figure 11:
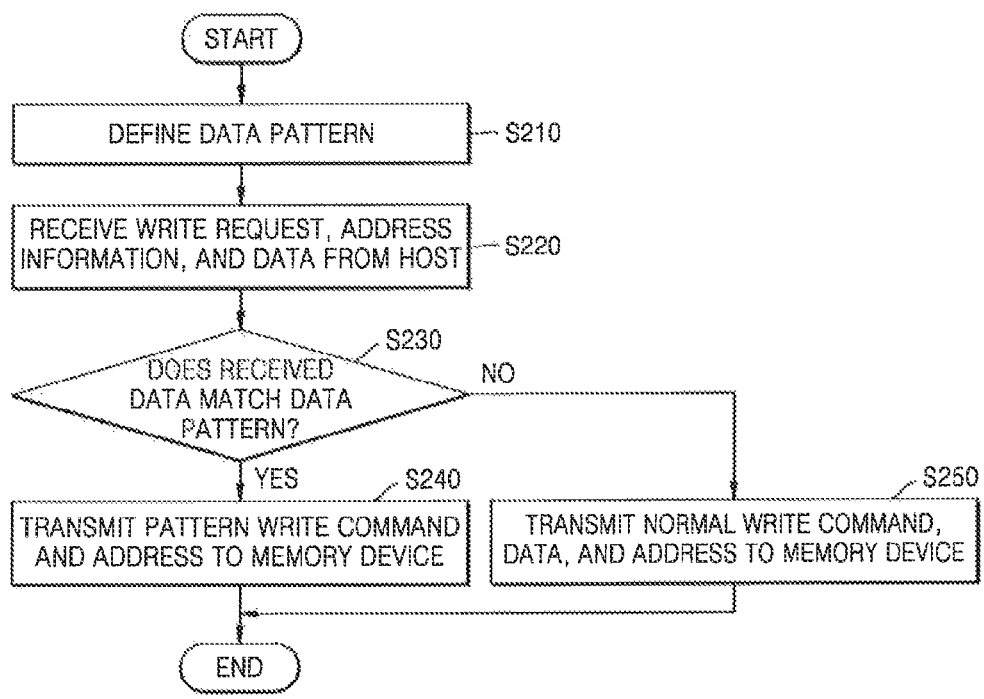
FIG. 11 is a flowchart of an operation method performed by a memory controller, according to an exemplary embodiment of the inventive concept.

FIG. 11 is a flowchart of an operation method performed by the memory controller 200, according to an exemplary embodiment of the inventive concept.

Referring to FIG. 11, the memory controller 200 defines a data pattern (S210). The data pattern may be data that is determined in advance between the memory controller 200 and the memory device 100. For example, the data pattern may be data having consecutive bits of '0' or '1.' Alternatively, the data pattern may be data that is previously provided to the memory device 100 as write data. Alternatively, the data pattern may be received from the host as user defined data. Alternatively, the data pattern may be data that is frequently written to the memory device 100. The memory controller 200 may analyze data that is requested to be written to the memory device 100. If the number of write requests for the data is more than a preset threshold value, the data may be identified as frequently used data and defined as a data pattern. Alternatively, the data pattern may be various types of data defined during operations of the memory controller 200 and the memory system 1000. The memory controller 200 may store information about the data pattern or store the data pattern itself in the pattern buffer 220. The memory controller 200 may provide the information about the data pattern or the data pattern to the memory device 100. Then, as described with reference to operation S110 of FIG. 9, the memory device 100 may store the information about the data pattern or the data pattern, received from the memory controller 200, in the pattern buffer 181 of FIG. 3, and thus define the data pattern.

When a write request, data, and address information are received from the host (S220), the memory controller 200 may compare the received data with the predefined data pattern (S230). When the received data matches the predefined data pattern, the memory controller 200 may transmit a pattern write command and an address signal to the memory device 100 (S240). When the received data does not match the predefined data pattern, the memory controller 200 may transmit a normal write command, the data, and an address signal to the memory device 100 (S250).

Figure 12:
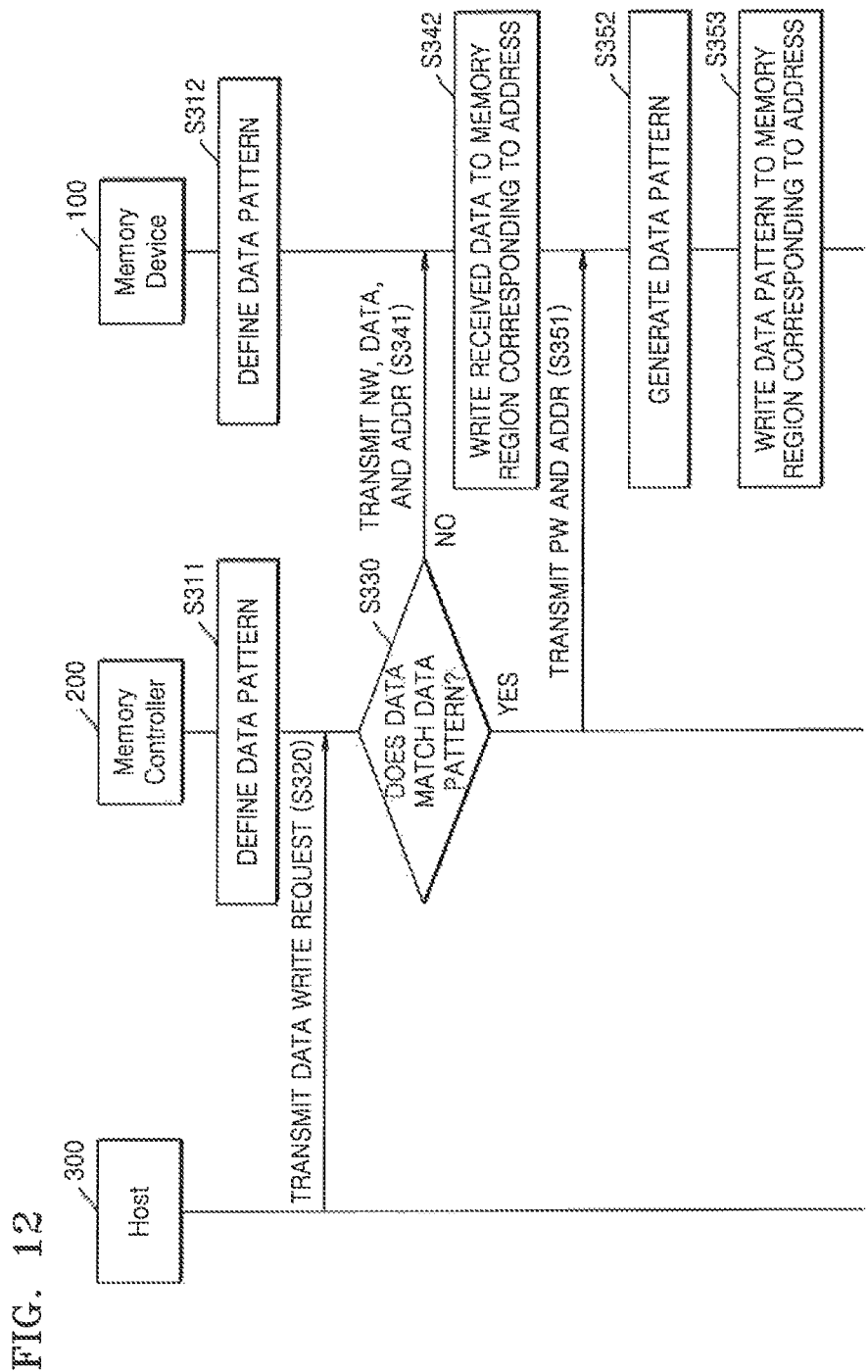
FIG. 12 is a flowchart of an operation method of an electronic device including a memory device, according to an exemplary embodiment of the inventive concept.

FIG. 12 is a flowchart of an operation method of an electronic device including the memory device 100, according to an exemplary embodiment of the inventive concept. The electronic device may include a host 300, the memory controller 200, and the memory device 100. FIG. 12 shows a write operation from among a plurality of normal operations of the electronic device.

Referring to FIG. 12, the memory device 100 and the memory controller 200 define a data pattern (S311 and S312). As described above with reference to FIGS. 9 to 11, the data pattern may be data determined by the memory device 100 and the memory controller 200 together, and thus, an identical data pattern may be defined in the memory controller 200 and the memory device 100.

When a write request is received from the host 300 (S320), the memory controller 200 may compare the received data DATA with the predefined data pattern and determine whether they match (S330). When the received data DATA does not match the predefined data pattern, the memory controller 200 may transmit the normal write command NW, the address signal ADDR, and the data DATA to the memory device 100 (S341). The memory device 100 may write the data to a memory region corresponding to the address signal ADDR (S342).

When the received data DATA matches the predefined data pattern, the memory controller 200 may transmit the pattern write command PW and the address signal ADDR to the memory device 100 (S351). The memory device 100 may generate a data pattern in response to the pattern write command PW (S352). In this case, the data pattern may be generated based on one of the data patterns that are preset in operation S312. According to an exemplary embodiment of the inventive concept, the generated data pattern may be one of the plurality of data patterns that are preset in operation S312. The memory device 100 may write the data pattern to a memory region corresponding to the address signal ADDR (S353).

Figure 13:
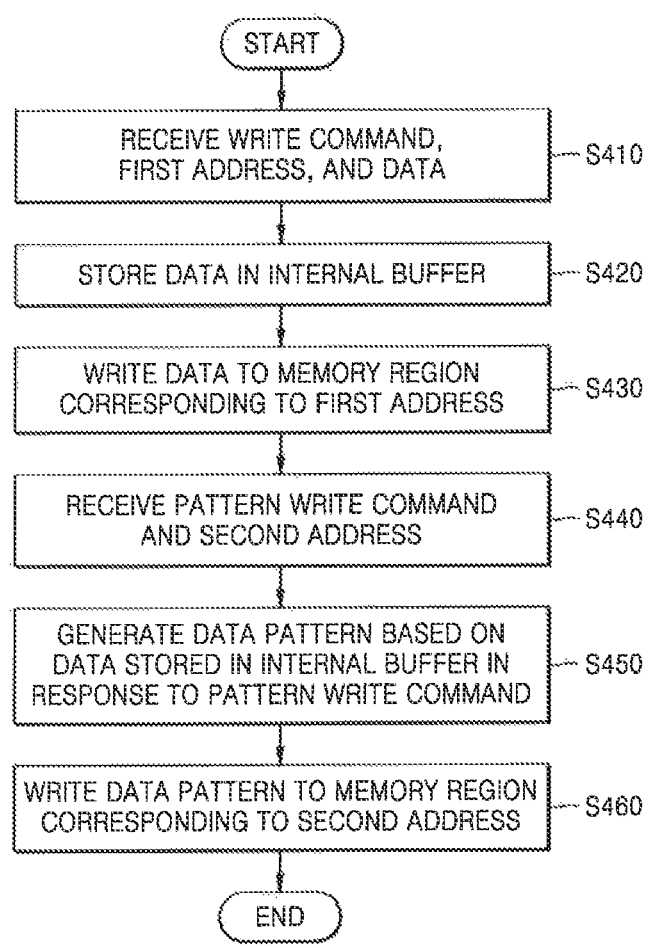
FIG. 13 is a flowchart of a writing method performed by a memory device, according to an exemplary embodiment of the inventive concept.

FIG. 13 is a flowchart of a writing method performed by the memory device 100, according to an exemplary embodiment of the inventive concept. The writing method of FIG. 13 is an exemplary embodiment of the writing method of FIG. 9, when data previously written to the memory device 100 is defined as a data pattern.

Referring to FIG. 13, the memory device 100 may receive a write command, a first address (or an address signal), and data from the memory controller 200 (S410). In this case, the write command may be a normal write command. The memory device 100 may store the data in an internal buffer, for example, the pattern buffer 181 of FIG. 3 (S420), and write the data to a memory region corresponding to the first address (S430). According to an exemplary embodiment of the inventive concept, operations S410 and S420 may be performed many times to store a plurality of data in the internal buffer. According to an exemplary embodiment of the inventive concept, since the capacity of the internal buffer is limited, data received by the memory device 100 at a relatively later time, e.g., data received at a time period near a current time period, may be updated to the internal buffer.

Thereafter, when the pattern write command and a second address are received (S440), the memory device 100 may generate a data pattern based on the data stored in the internal buffer (S450). In response to the pattern write command, the memory device 100 may select one of the plurality of data stored in the internal buffer, and then output the selected data as the data pattern.

The memory device 100 may write the data pattern to a memory region corresponding to the second address (S460). The second address may indicate the same memory region as the first address, or alternatively, may indicate a different memory region from the first address. For example, the second address may indicate a memory region near the first address.

Figure 14:
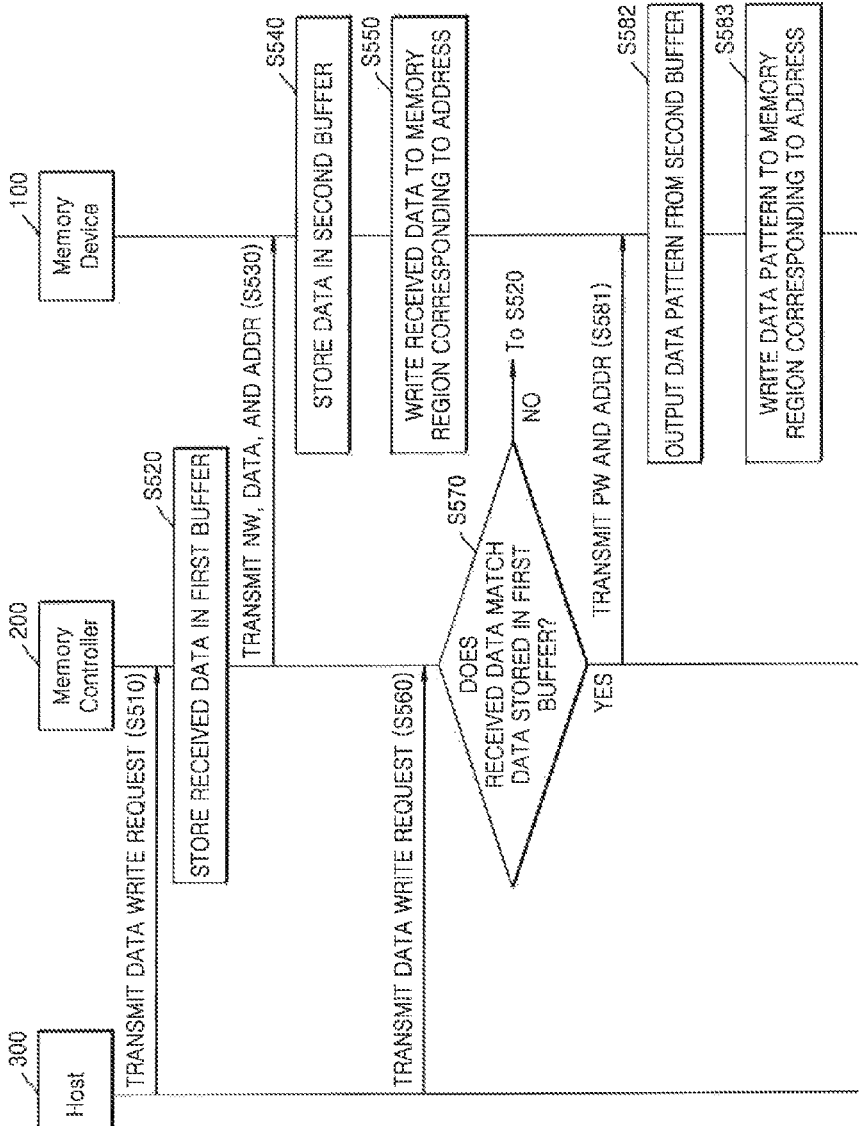
FIG. 14 is a flowchart of an operation method of an electronic device including a memory device, according to an exemplary embodiment of the inventive concept.

FIG. 14 is a flowchart of an operation method of an electronic device including a memory device, according to an exemplary embodiment of the inventive concept. The electronic device may include a memory device that performs a write operation according to the writing method of FIG. 13. The electronic device may include the host 300, the memory controller 200, and the memory device 100. FIG. 14 shows a write operation from among a plurality of normal operations of the electronic device. According to the present exemplary embodiment, each of the memory controller 200 and the memory device 100 may include a pattern buffer that stores a data pattern. A pattern buffer of the memory controller 200 is referred to as a first buffer, and a pattern buffer of the memory device 100 is referred to as a second buffer.

Referring to FIG. 14, the host 300 may send a data write request to the memory controller 200 (S510). The host 300 may transmit a write request signal, data to be written, and an address signal to the memory controller 200. When the data write request is received from the host 300 (S510), the memory controller 200 may store the data that received with the data write request in the first buffer (S520). The memory controller 200 may transmit the normal write command NW, the address signal ADDR, and the data to the memory device 100 (S530).

The memory device 100 may store the data received from the memory controller 200 in the second buffer (S540), and write the data to a memory region corresponding to the address signal ADDR (S550).

With respect to operations S510 to S550, the data written to the memory device 100 may be defined as a data pattern.

When a data write request is received again from the host 300 (S560), the memory controller 200 may compare received data with data stored in the first buffer, e.g., a predefined data pattern, and determine whether the received data matches the data stored in the first buffer (S570).

When the data does not match the data stored in the first buffer, operations S520 to S550 may be performed. Data requested to written by the host 300 may be written to the memory device 100. In this case, the memory controller 200 may store the data from the host 300 in the first buffer and thus update a data pattern of the first buffer. Also, the memory device 100 may write data received from the memory controller 200 to a new memory region corresponding to the address signal ADDR and store the data in the second buffer to update a data pattern of the second buffer. The updating of the first buffer and the second buffer will be described below with reference to FIG. 15.

When the data matches the data stored in the first buffer, the memory controller 200 may provide the pattern write command PW and the address signal ADDR to the memory device 100 (S581). The memory device 100 may output the data pattern stored in the second buffer in response to the pattern write command PW (S582). According to an exemplary embodiment of the inventive concept, when a plurality of data patterns are stored in the second buffer, the memory device 100 may select and output one of the plurality of data patterns in response to the pattern write command PW. The memory device 100 may write the data pattern to a memory region corresponding to the address signal ADDR (S583).

The data requested to be written to the memory device 100 may have temporal locality. For example, when image data of a frame is stored in the memory device 100, identical pieces of data may be consecutively stored in the memory device 100. Therefore, the host 300 may consecutively request the identical pieces of data to be written to the memory controller 200. Then, the memory controller 200 and the memory device 100 may store data, transmitted and received therebetween for a data write operation, as a data pattern in their respective pattern buffers. When the host 300 requests to write the data again, instead of transmitting the data to the memory device 100, the memory controller 200 may provide the pattern write command PW to the memory device 100, and in response to the pattern write command PW, the memory device 100 may output a corresponding data pattern from the pattern buffer and write the corresponding data pattern to the memory cell array 110.

Figure 15A:
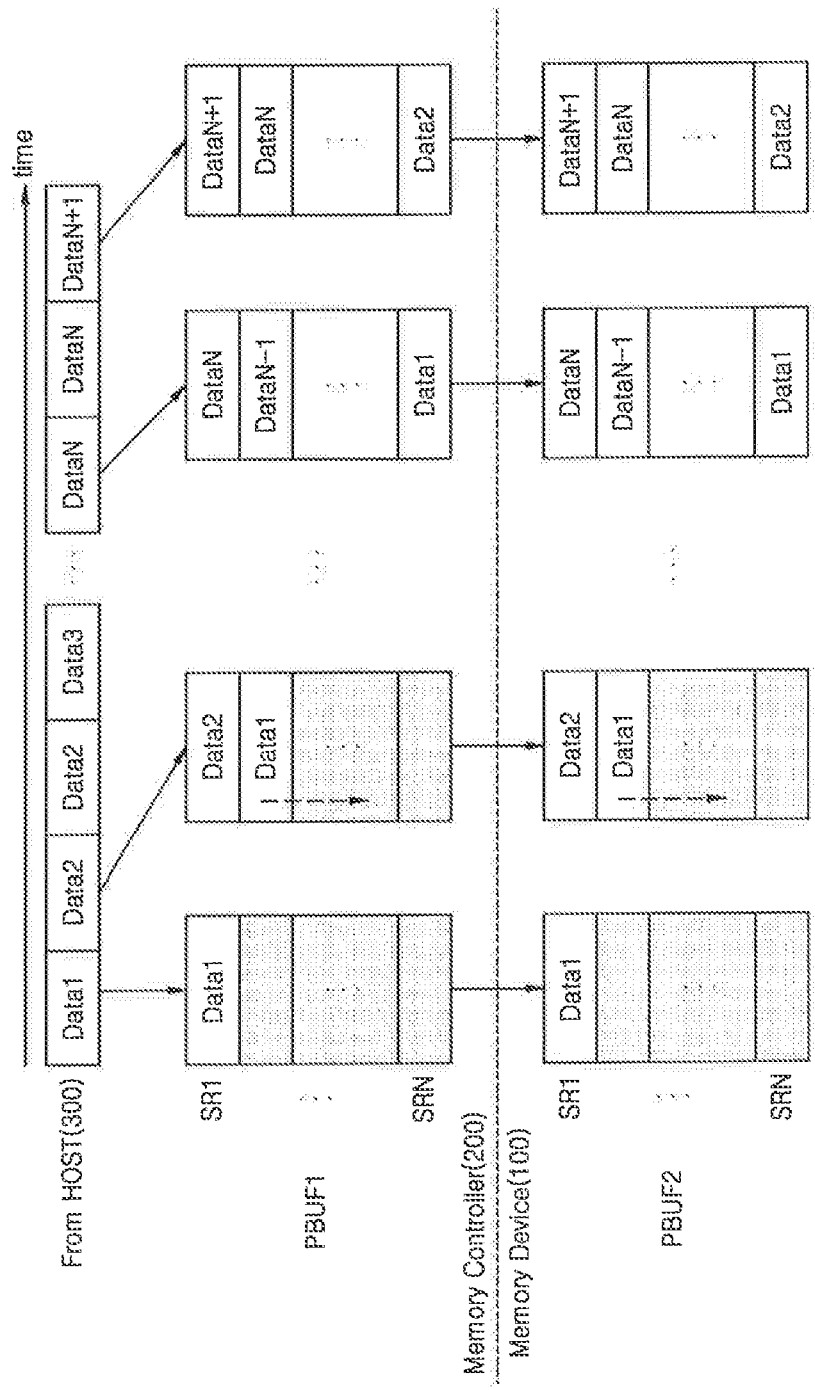
FIGS. 15A and 15B are diagrams to describe how pattern buffers are updated in each of a memory controller and a memory device in an electronic device according to an exemplary embodiment of the inventive concept.
Figure 15B:
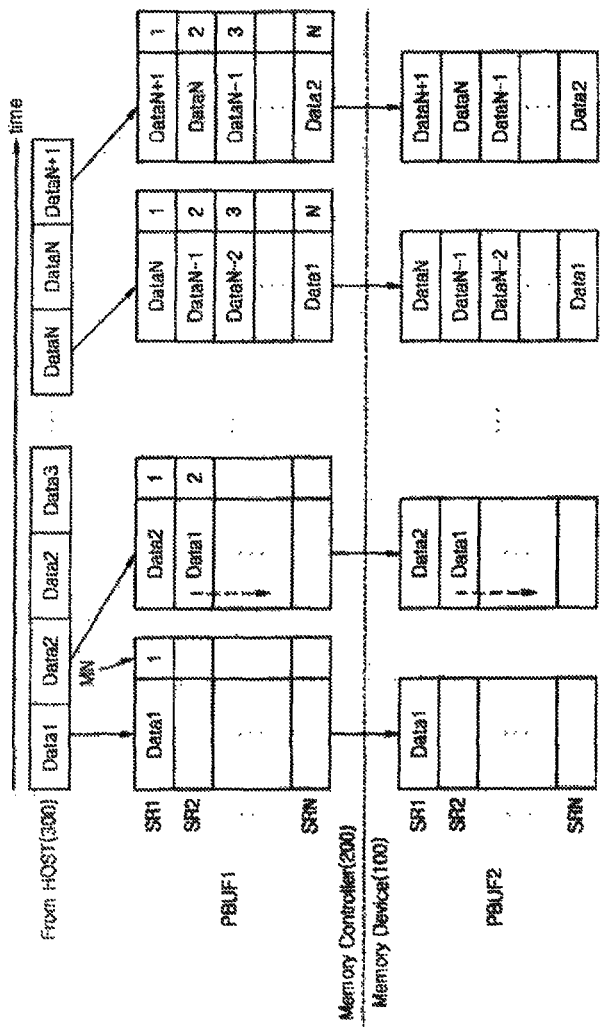

FIGS. 15A and 15B are diagrams to describe how pattern buffers are updated in each of the memory controller 200 and the memory device 100 in an electronic device, according to an exemplary embodiment of the inventive concept. FIGS. 15A and 15B show exemplary embodiments of the updating of a first pattern buffer and a second pattern buffer, performed in operations S520 and S540, respectively, as shown in the flowchart of FIG. 14.

Referring to FIG. 15A, the memory controller 200 may receive a plurality of data, e.g., Data1 to DataN+1, sequentially from the host 300. The received data may be the same as previously received data or may be different from previously received data. For example, first data Data1 may be received, and then, the first data Data1 may be received again or second data Data2 different from the first data Data1 may be received. Alternatively, the first data Data1 may be received, new pieces of data may be received, and then the first data Data1 may be received again.

The memory controller 200 may store the received data in a first pattern buffer PBUF1 therein. Then, the memory controller 200 may provide the received data to the memory device 100. The memory device 100 may write the received data to the memory cell array 110, and store the received data in a second pattern buffer PBUF2 therein.

When new data received from the host 300 is the same as previously received data, as described above, instead of providing the new data to the memory device 100, the memory controller 200 may provide a pattern write command to the memory device 100. The pattern write command may include a signal for indicating a pattern write operation and a signal for selecting a data pattern from among a plurality of data stored in the second pattern buffer PBUF2.

For example, when the memory controller 200 receives a write request and the first data Data1 from the host 300, the memory controller 200 may store the first data Data1 in the first pattern buffer PBUF1, and provide the first data Data1 to the memory device 100. Then, when the first data Data1 is received again from the host 300, the memory controller 200 may provide the pattern write command to the memory device 100. Thereafter, when the second data Data2, which is different from the first data Data1, is received from the host 300, the memory controller 200 may store the second data Data2 in the first pattern buffer PBUF1 and provide the second data Data2 to the memory device 100. In a similar manner, the memory controller 200 may store N pieces of new data in the first pattern buffer PBUF1. In this case, the first pattern buffer PBUF1 includes N storage areas SR1 to SRN, and thus can store N pieces of data.

When new data, e.g., (N+1)-th data (DataN+1), that is different from other data stored in the first pattern buffer PBUF1, is received from the host 300, the memory controller 200 may delete data stored earliest in the first pattern buffer PBUF1, e.g., the first data Data1, and may then store the (N+1)-th data (DataN+1) in the first pattern buffer PBUF1. Accordingly, the memory controller 200 may update a data pattern of the first pattern buffer PBUF1 by deleting old data and storing new data in the first pattern buffer PBUF1.

According to an exemplary embodiment of the inventive concept, when new data, e.g., the (N+1)-th data (DataN+1), that is different from other data stored in the first pattern buffer PBUF1, is received from the host 300, the memory controller 200 may delete data matching the earliest received data from among the data stored in the first pattern buffer PBUF1, and store the (N+1)-th data (DataN+1) in the first pattern buffer PBUF1.

Referring to FIG. 15B, the memory controller 200 may store data in the first pattern buffer PBUF1 and a matching order MN of the stored data. The matching order MN may indicate an order of received data in the first pattern buffer PBUF1 from the host 300, in the order of newest to oldest. A low number of the matching order MN indicates that the data was recently received from the host 300. For example, a matching order MN may be low for data that was most recently written to the first pattern buffer PBUF1 or data that was most recently matched. When the first pattern buffer PBUF1 has N storage areas, the data that was most recently written to the first pattern buffer PBUF1 or matched may have a matching order MN of 1, and data that was written or matched the earliest may have a matching order MN of N. The matching order MN may be updated whenever data is received from the host 300.

When data is stored in all of the storage areas of the first pattern buffer PBUF1 and new data, e.g., the (N+1)-th data (DataN+1), is received, the memory controller 200 may update a data pattern of the first pattern buffer PBUF1 by deleting data that was matched the earliest, e.g., data having a matching order MN of N, e.g., Data1, and storing the (N+1)-th data (DataN+1).

When the memory device 100 receives data from the memory controller 200, the memory device 100 may store the received data in a corresponding memory cell area and in the second pattern buffer PBUF2. The memory device 100 may store the received data in the second pattern buffer PBUF2 by using substantially the same method as the memory controller 200. According to an exemplary embodiment of the inventive concept, the capacities and data storage orders (e.g., matching order MN) of the first pattern buffer PBUF1 and the second pattern buffer PBUF2 may be the same. Identical pieces of data may be stored in the first pattern buffer PBUF1 and the second pattern buffer PBUF2 according to an identical data storage order. Therefore, without an additional command or an address signal for setting a location in a pattern buffer, identical data patterns between the memory controller 200 and the memory device 100 may be stored at a substantially identical location and/or in a substantially identical order in the first pattern buffer PBUF1 of the memory controller 200 and the second pattern buffer PBUF2 of the memory device 100.

FIG. 16 is a table showing an example of setting a write command, according to an exemplary embodiment of the inventive concept. FIG. 16 shows an example of setting a write command transmitted between a memory device and a memory controller based on the writing method of FIG. 13. In particular, FIG. 16 shows an extended example of the third pattern write command PW3 that instructs previously written data to be written to the memory cell array 110 as a data pattern.

Referring to FIG. 16, the third pattern write command PW3 is set according to signals received via address pins CAx, CAy, CAz, CAj, CAk, and CAl. A value received via the first three address pins CAx, CAy, and CAz, e.g., '0 1 1,' may indicate a write command for instructing selection of one of a plurality of previously written data and writing the selected data to a memory cell array. The second three address pins CAj, CAk, and CAl may indicate which previously written data to select from among the plurality of previously written data. Referring to FIGS. 15A and 15B, the memory device 100 stores the previously written data in the second pattern buffer PBUF2. The memory device 100 may select one of the plurality of previously written data stored in the second pattern buffer PBUF2 based on the third pattern write command PW3 received via the address pins CAx, CAy, CAz, CAj, CAk, and CAl. For example, the second pattern buffer PBUF2 may store eight pieces of previously written data, select one of the eight pieces of previously written data based on values received via the address pins CAj, CAk, and CAl of the memory device 100, and store the selected piece of previously written data in a memory region corresponding to the address signal ADDR.

Although FIG. 16 shows that the second pattern buffer PBUF2 stores eight pieces of previously written data, this is merely an exemplary embodiment of the inventive concept. The numbers of pieces of previously written data stored in the second pattern buffer PBUF2 may vary.

Figure 17:
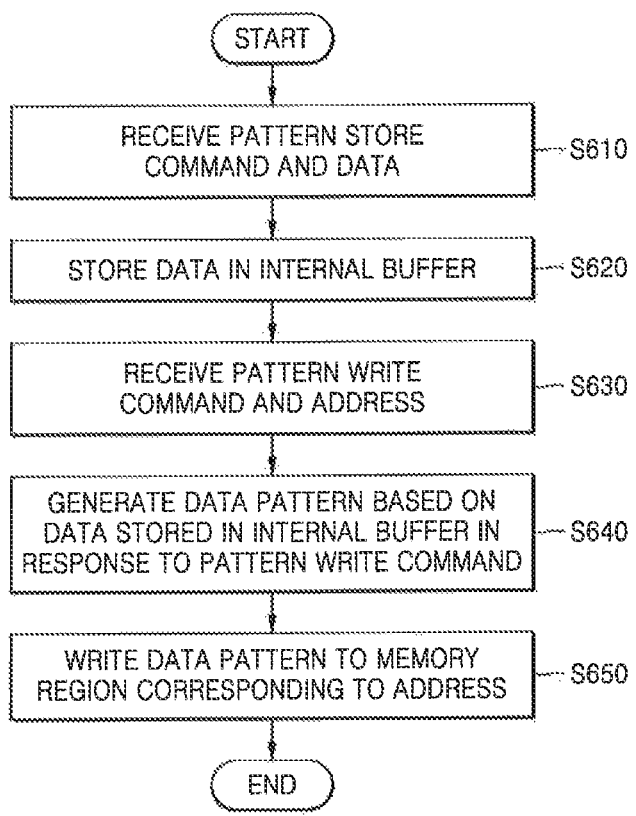
FIG. 17 is a flowchart of a writing method performed by a memory device, according to an exemplary embodiment of the inventive concept.

FIG. 17 is a flowchart of a writing method performed by a memory device, according to an exemplary embodiment of the inventive concept. The writing method of FIG. 17 is an exemplary embodiment of the writing method of FIG. 9 when user defined data is defined as a data pattern.

Referring to FIG. 17, the memory device 100 receives a pattern store command and data from the memory controller 200 (S610). The pattern store command may be a command for instructing received data to be stored in an internal buffer instead of the memory cell array 110 of the memory device 100. The received data may be user defined data. For example, the user defined data may be data frequently stored in the memory device 100 in relation to operations of an electronic device that includes the memory device 100. A host of the electronic device, e.g., a host processor, may analyze data frequently stored in the memory device 100 and provide the frequently stored data to the memory device 100 as the user defined data.

In response to the pattern store command, the memory device 100 may store the data, e.g., the user defined data, in the internal buffer (S620). According to an exemplary embodiment of the inventive concept, operations S610 and S620 may be performed many times to store a plurality of user defined data in the internal buffer.

Thereafter, when a pattern write command and an address are received (S630), in response to the pattern write command, the memory device 100 may generate a data pattern based on the user defined data stored in the internal buffer (S640). According to an exemplary embodiment of the inventive concept, in response to the pattern write command, the memory device 100 may select one of the plurality of user defined data, and output the selected data as the data pattern.

The memory device 100 may write the data pattern, e.g., the user defined data, to a memory region corresponding to the address (S650).

Figure 18:
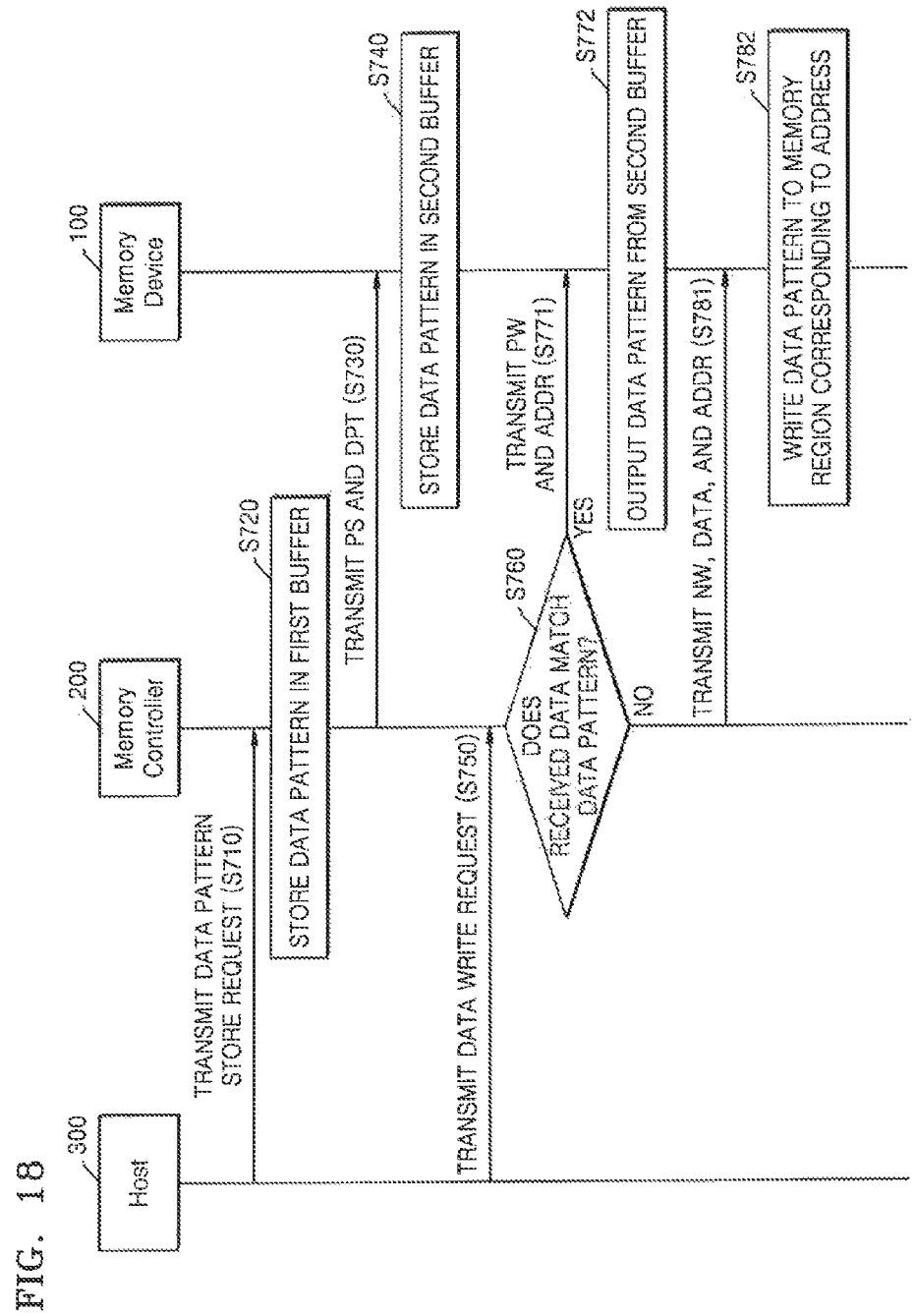
FIG. 18 is a flowchart of an operation method of an electronic device including a memory device, according to an exemplary embodiment of the inventive concept.

FIG. 18 is a flowchart of an operation method of an electronic device including a memory device, according to an exemplary embodiment of the inventive concept. The electronic device may include the host 300, the memory controller 200, and the memory device 100. FIG. 18 shows a write operation from among a plurality of normal operations of the electronic device. According to an exemplary embodiment of the inventive concept, each of the memory controller 200 and the memory device 100 may include a pattern buffer that stores a data pattern. A pattern buffer of the memory controller 200 is referred to as a first buffer, and a pattern buffer of the memory device 100 is referred to as a second buffer.

Referring to FIG. 18, the memory controller 200 receives a data pattern store request from the host 300 (S710). According to an exemplary embodiment of the inventive concept, when the host 300 transmits a data write request, data, and invalid address information, the memory controller 200 may interpret the data write request as the data pattern store request. The memory controller 200 may store the data received from the host 300 as a data pattern in the first buffer (S720). The stored data pattern may be referred to as a user-defined data pattern DPT. The memory controller 200 may transmit a pattern store command PS and the user-defined data pattern DPT to the memory device 100 (S730). The memory device 100 may store the user-defined data pattern DPT in the second buffer in response to the pattern store command PS (S740). Accordingly, the user-defined data pattern DPT may be defined in the memory controller 200 and the memory device 100.

Thereafter, when the data write request is received from the host 300 (S750), the memory controller 200 may compare the received data with the data pattern stored in the first buffer and determine whether the received data matches the data pattern (S760).

When the received data matches the data pattern, the memory controller 200 may transmit a pattern write command PW and an address signal ADDR to the memory device 100 (S771). The memory device 100 may output the data pattern stored in the second buffer in response to the pattern write command PW (S772). In other words, the memory device 100 may output the user-defined data pattern DPT.

When the received data does not match the data pattern, the memory controller 200 may transmit a normal write command NW, an address signal ADDR, and data DATA to the memory device 100 (S781).

The memory device 100 may write the data pattern (e.g., the user-defined data pattern DPT) or the received data to a memory region corresponding to the address signal ADDR (S782).

Figure 19:
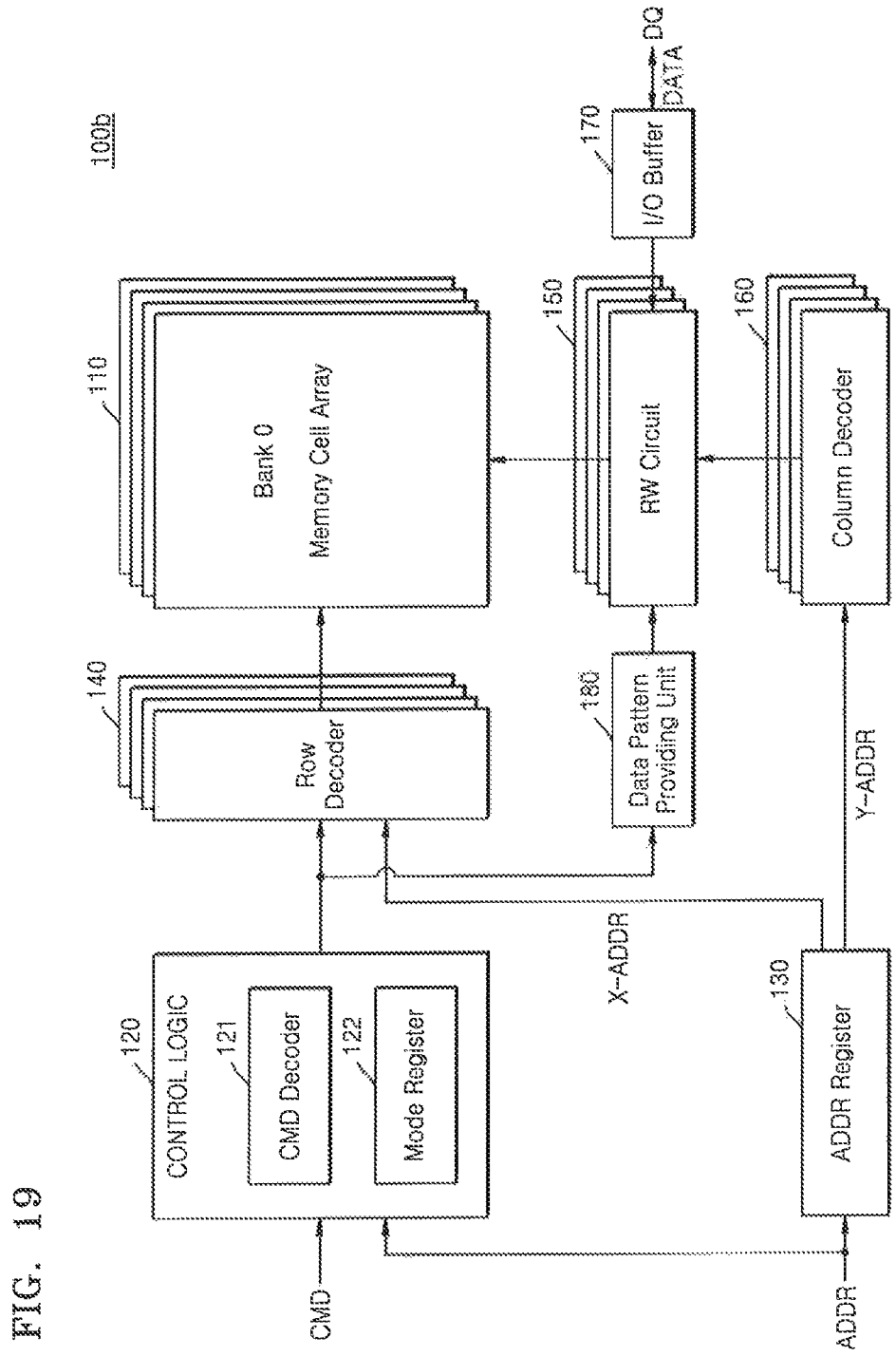
FIG. 19 is a schematic block diagram of a memory device according to an exemplary embodiment of the inventive concept.

FIG. 19 is a schematic block diagram of a memory device 100b according to an exemplary embodiment of the inventive concept. The memory device 100b of FIG. 19 is a modified example of the memory device 100 of FIG. 2. Features described above with reference to FIG. 2 may also be applied to the memory device 100b of FIG. 19.

Referring to FIG. 19, the memory device 100b includes a plurality of banks (e.g., memory banks). The banks may be groups of simultaneously accessible memory cells. In general, the banks may be distinguished according to address signals ADDR. For example, although not shown, the banks may be distinguished according to received bank address signals. The banks may be different from one another and function independently. For example, the banks may independently perform read and write operations.

In FIG. 19, each of a plurality of row decoders 140, read and write circuits 150, and column decoders 160 may correspond to one of a plurality of memory cell arrays 110. In this case, each of the plurality of memory cell arrays 110 may configure one bank. However, the inventive concept is not limited thereto. For example, two or more memory cell arrays may configure one bank, or a single row decoder 140 or a single column decoder 160 may correspond to two or more memory cell arrays.

The data pattern providing unit 180 and the I/O buffer 170 may be connected to the read and write circuits 150 of different banks. The data pattern providing unit 180 may provide data patterns to the read and write circuits 150, and the I/O buffer 170 may transmit data output from the read and write circuits 150 to external devices or provide data received from the external devices to the read and write circuits 150.

According to an exemplary embodiment of the inventive concept, when the memory device 100b receives a pattern write command from an external source, without receiving data from the external source, the memory device 100b may write data provided from the data pattern providing unit 180 to a memory region corresponding to the address signal ADDR. Each of the banks may independently and simultaneously perform read and write operations. In this case, since the banks share the I/O buffer 170 and the data pad (DQ), there may be a conflict when the banks simultaneously perform the read and write operations. For example, when a first bank is using the I/O buffer 170 and the data pad DQ and a second bank attempts to use the I/O buffer 170 and the data pad DQ, the second bank has to wait until the first bank finishes using the I/O buffer 170 and the data pad DQ, which may delay the read and write operations. However, in the memory device 100b according to an exemplary embodiment of the inventive concept, the I/O buffer 170 and the data pad DQ are not used when performing a write operation with a pattern write command, as described above. Accordingly, when one of the banks performs the pattern write operation, other banks may simultaneously perform normal write operations or read operations and use the I/O buffer 170 and the data pad (DQ). Thus, operation speed of the memory device 100b may increase.

Figure 20:
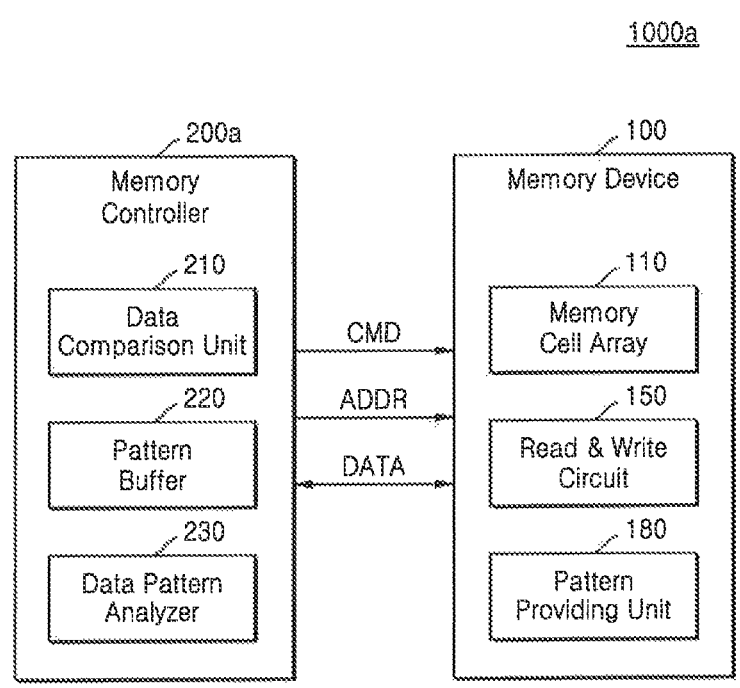
FIG. 20 is a block diagram of a memory system according to an exemplary embodiment of the inventive concept.

FIG. 20 is a block diagram of a memory system 1000a according to an exemplary embodiment of the inventive concept.

Referring to FIG. 20, the memory system 1000a includes a memory controller 200a and the memory device 100. The memory controller 200a may include the data comparison unit 210, the pattern buffer 220, and a data pattern analyzer 230. The memory device 100 may include the memory cell array 110, the read and write circuit 150, and the data pattern providing unit 180. The memory system 1000a of FIG. 20 is a modified example of the memory system 1000 of FIG. 1. Features described above with reference to FIG. 1 may also be applied to the present exemplary embodiment of FIG. 20, and thus, descriptions of similar features will be omitted.

The data pattern analyzer 230 of the memory controller 200a may analyze data received from an external source, e.g., a host, and determine frequently used data, e.g., data frequently written to the memory device 100. For example, the data pattern analyzer 230 may determine data that has a number of write requests from the host greater than a preset threshold value as the frequently used data. The memory controller 200a may store the frequently used data as a data pattern in the pattern buffer 220 and transmit the frequently used data to the memory device 100. The memory device 100 may store the received frequently used data in a pattern buffer provided in the data pattern providing unit 180. Accordingly, the frequently used data may be defined as the data pattern in the memory controller 200a and the memory device 100. According to an exemplary embodiment of the inventive concept, the data pattern providing unit 180 may function as the pattern buffer.

The data comparison unit 210 may compare the data requested to be written by the host with data patterns stored in the pattern buffer 220, and determine whether the data matches one of the data patterns. When the data matches one of the data patterns, the memory controller 200a does not transmit the data to the memory device 100 but transmits the pattern write command and the address signal ADDR to the memory device 100. The memory device 100 may select one of data patterns stored in the pattern buffer based on the pattern write command, and write the selected data pattern to the memory cell array 110.

In the memory system 1000a according to the present exemplary embodiment, the memory controller 200a may analyze the data requested to be written, and determine frequently used data that is frequently written to the memory device 100. The memory controller 200a and the memory device 100 may agree to use the frequently used data as a data pattern, so that the frequently used data may be written to the memory cell array 110 of the memory device 100 without transmitting data between the memory controller 200a and the memory device 100, as described above.

Figure 21:
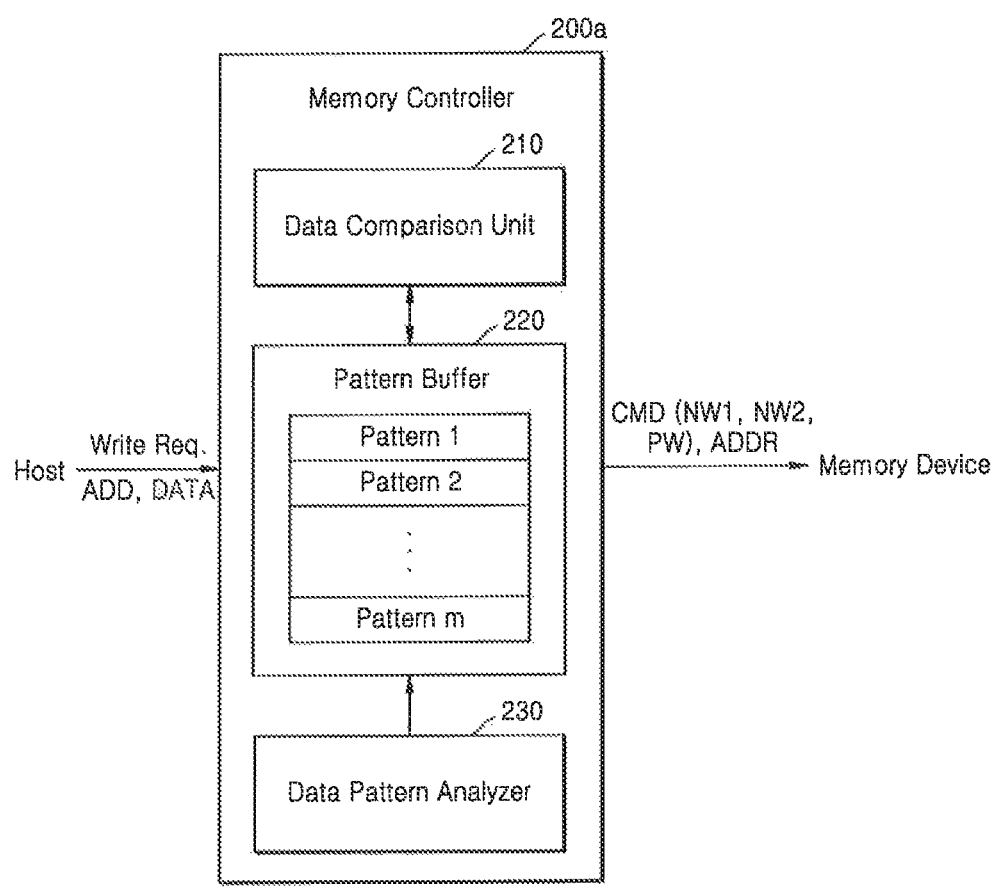
FIG. 21 is a block diagram of an example of a memory controller, according to an exemplary embodiment of the inventive concept.

FIG. 21 is a block diagram of an example of a memory controller, according to an exemplary embodiment of the inventive concept. FIG. 21 is an exemplary embodiment of the memory controller 200a of the memory system 1000a of FIG. 20.

Referring to FIG. 21, the data pattern analyzer 230 analyzes data received with the write request from the host and determines frequently used data. According to an exemplary embodiment of the inventive concept, the data pattern analyzer 230 may determine the frequently used data as data that has a number of write requests from the host greater than a preset threshold value. According to an exemplary embodiment of the inventive concept, the data pattern analyzer 230 may determine the frequently used data as data that has been requested to be written by the host more than the preset threshold value within a preset time period.

The data pattern analyzer 230 may provide the frequently used data to the pattern buffer 220, and the pattern buffer 220 may store the frequently used data as a data pattern. The pattern buffer 220 may store a plurality of data patterns. The memory controller 200a may transmit data defined as a data pattern to the memory device 100 of FIG. 20, along with an address signal ADDR and a second normal write command NW2. When the second normal write command NW2 is transmitted, the memory device 100 may store the data in a memory region corresponding to the address signal ADDR and an internal pattern buffer. Accordingly, the data may be defined as a data pattern in the memory controller 200a and the memory device 100.

When a write request is continuously received from the host, the data comparison unit 210 may compare data requested to be written with the data patterns stored in the pattern buffer 220. If the data matches one of the data patterns, the memory controller 200a may transmit a pattern write command PW and the address signal ADDR to the memory device 100. If the data does not match any of the data patterns, the memory controller 200a may transmit a first normal write command NW1, the data, and the address signal ADDR to the memory device 100. Based on the pattern write command PW, the memory device 100 may output one of the data patterns stored in the internal pattern buffer, and write the output data to a memory region corresponding to the address signal ADDR. Alternatively, based on the first normal write command NW1, the memory device 100 may write the received data to a memory region corresponding to the address signal ADDR.

FIG. 22 is a table showing an example of different settings for a write command, according to an exemplary embodiment of the inventive concept.

Referring to FIG. 22, a mode signal '0 0 0' received via address pins CAx, CAy, and CAz indicates a first normal write command NW1. When the mode signal '0 0 0' is received via the address pins CAx, CAy, and CAz, data may be transmitted from the memory controller 200a to the memory device 100 via the data pad DQ. In response to the first normal write command NW1, the memory device 100 may write the data received from the memory controller 200 to the memory cell array 110.

A mode signal '0 0 1' received via the address pins CAx, CAy, and CAz indicates a second normal write command NW2. When the mode signal '0 0 1' is received via the address pins CAx, CAy, and CAz, data may be transmitted from the memory controller 200a to the memory device 100 via the data pad DQ. In response to the second normal write command NW2, the memory device 100 may write the data received from the memory controller 200 to the memory cell array 110 and the pattern buffer. Accordingly, a data pattern may be stored in the pattern buffer of the memory device 100.

A signal '1' received via the address pin CAx indicates buffer data, e.g., a pattern write command PW that instructs data stored in a pattern buffer to be written to a memory cell array. Since there is no data transmission between the memory controller 200a and the memory device 100 when the pattern write command PW is received, the data pad DQ is not used. As described above with reference to FIGS. 20 and 21, the data stored in the pattern buffer may be frequently used data. According to signals received via the address pins CAy and CAz, one of the data patterns (e.g., Buffer Data 1 to Buffer Data 3) stored in the pattern buffer may be selected and output.

Heretofore, with respect to FIG. 22, examples of a write command that may be transmitted to the memory device 100 of the memory system 1000a of FIG. 20 have been described. However, the inventive concept is not limited thereto. Various signals may indicate a normal write command and/or a pattern write command.

Figure 23:
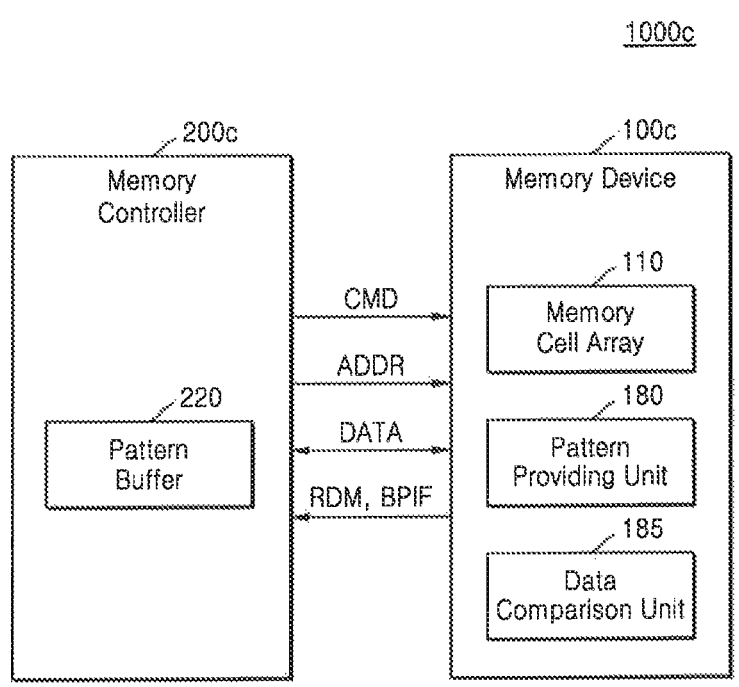
FIG. 23 is a block diagram of a memory system according to an exemplary embodiment of the inventive concept.

FIG. 23 is a block diagram of a memory system 1000c according to an exemplary embodiment of the inventive concept.

Referring to FIG. 23, the memory system 1000c includes a memory controller 200c and a memory device 100c. The memory controller 200c may include the pattern buffer 220, and the memory device 100c may include the memory cell array 110, the data pattern providing unit 180, and a data comparison unit 185. Although not illustrated, the memory controller 200c may further include a data comparison unit and a data pattern analyzer, as described above.

As described above with reference to FIGS. 1 to 22, the memory controller 200c and the memory device 100c may predetermine a data pattern. When data requested to be written by a host matches the data pattern, the memory controller 200c may transmit a pattern write command to the memory device 100c without transmitting data, and the memory device 100c may write the data pattern to the memory cell array 110 in response to the pattern write command.

When data read from the memory cell array 110 of the memory system 1000c of FIG. 23 matches the data pattern, the memory device 100c may transmit preset pattern read signals, e.g., a matching signal RDM and pattern information BPIF, to the memory controller 200c instead of the read data. Based on the received pattern read signals, the memory controller 200c may transmit the data pattern to an external device, for example, the host.

For example, when the memory controller 200c transmits a read command CMD and an address signal ADDR to the memory device 100c, the memory device 100c may read data from a memory region of the memory cell array 110 corresponding to the address signal ADDR. The data comparison unit 185 may compare the read data with a data pattern received from the data pattern providing unit 180, or may access the data pattern providing unit 180 and compare a stored data pattern with the read data. When the read data matches the data pattern, the data comparison unit 185 may generate the matching signal RDM which indicates that the read data matches the data pattern.

The memory device 100c may transmit the matching signal RDM to the memory controller 200c. Also, when the read data matches one of the plurality of data patterns, the memory device 100c may provide information about the matching data pattern (e.g., a location of the matching data pattern in the pattern buffer) as the pattern information BPIF to the memory controller 200c.

The memory controller 200c may provide the data received from the memory device 100c as the read data to the host. However, when the matching signal RDM is received from the memory device 100c, the memory device 100c does not transmit the read data to the memory controller 200c. Instead, when the matching signal RDM is received, the memory controller 200c may transmit a predefined data pattern stored in the pattern buffer 220 to the host. According to an exemplary embodiment of the inventive concept, when a plurality of data patterns are stored in the pattern buffer 220, the memory controller 200c may select one of the data patterns based on the pattern information BPIF received from the memory device 100c, and transmit the selected data pattern to the host.

Accordingly, in the memory system 1000c according to the present exemplary embodiment, when the data read from the memory cell array 110 matches the predefined data pattern, without receiving data from the memory device 100c, the memory controller 200c may transmit the predefined data pattern as the read data to the host based on preset pattern read signals. Therefore, since there is no data transmission between the memory controller 200c and the memory device 100c, power consumption of the memory system 1000c may be reduced. Also, since data transmission time is reduced during read operations, operation speed of the memory system 1000c may increase.

Hereinafter, components and operations of the memory device 100c and the memory controller 200c will be described with reference to FIGS. 24 and 25.

Figure 24:
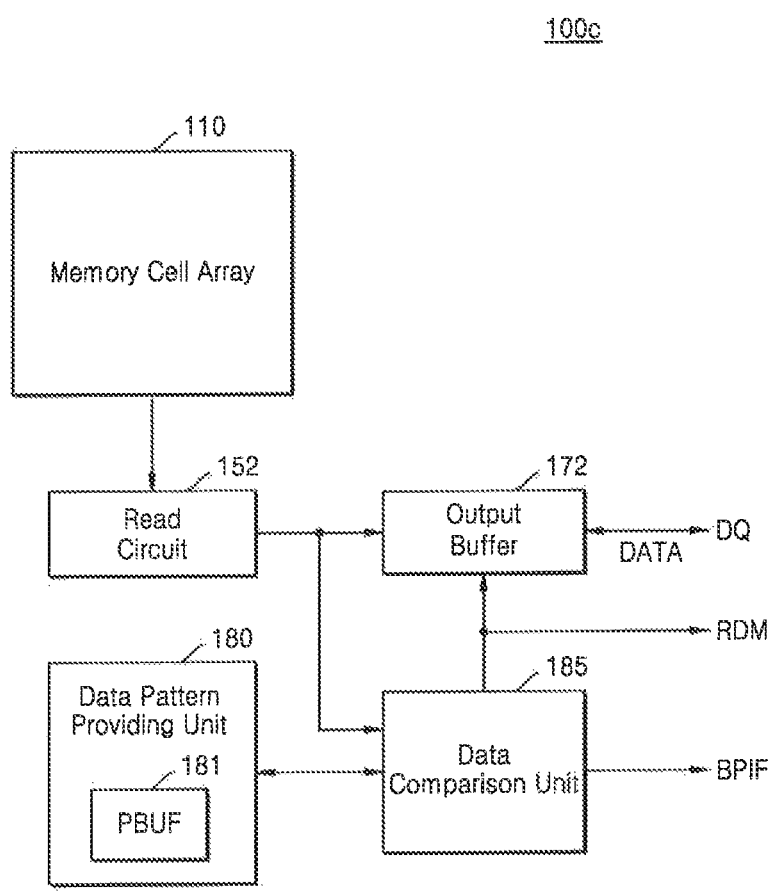
FIG. 24 is a schematic block diagram of a memory device according to an exemplary embodiment of the inventive concept.

FIG. 24 is a schematic block diagram of the memory device 100c according to an exemplary embodiment of the inventive concept. The memory device 100c of FIG. 24 may be applied to the memory system 1000c of FIG. 23. FIG. 24 shows main features of the memory device 100c related to a read operation. Features of the memory device 100 of FIG. 2, described above, may also be applied to the memory device 100c of FIG. 24.

Referring to FIG. 24, the memory device 100c includes the memory cell array 110, the read circuit 152, an output buffer 172, the data pattern providing unit 180, and the data comparison unit 185.

The read circuit 152 may read data from a memory region of the memory cell array 110 corresponding to an address signal. The read data may be provided to the output buffer 172 and the data comparison unit 185.

The output buffer 172 may be an element of the I/O buffer 170 of the FIG. 2 and transmit data DATA to an external device via the data pad DQ.

The data pattern providing unit 180 may output a predefined data pattern. According to an exemplary embodiment of the inventive concept, the data pattern providing unit 180 may generate the predefined data pattern. According to an exemplary embodiment of the inventive concept, the data pattern providing unit 180 may include the pattern buffer 181 that stores a plurality of data patterns.

The data comparison unit 185 may compare the read data received from the read circuit 152 with a data pattern output from the data pattern providing unit 180. Alternatively, the data comparison unit 185 may access the pattern buffer 181 and compare the read data with the plurality of data patterns stored therein. The data comparison unit 185 may output a matching signal RDM. When the read data matches the data pattern, the data comparison unit 185 may output the matching signal RDM having a first level, e.g., logic high. When the read data does not match the data pattern, the data comparison unit 185 may output the matching signal RDM having a second level, e.g., logic low. The matching signal RDM may be provided to the output buffer 172 and the memory controller 200c of FIG. 23.

Additionally, when the read data does not match the data pattern, the output buffer 172 may output the read data DATA to the memory controller 200c via the data pad DQ. However, when the read data matches the data pattern, output of the output buffer 172 may be blocked. The output of the output buffer 172 may be blocked in response to the matching signal RDM having the first level. Therefore, the read data is not transmitted via the data pad DQ. When the read data matches one of the data patterns stored in the pattern buffer 181, the data pattern providing unit 180 may output pattern information BPIF, which indicates a location of the matching data pattern in the pattern buffer 181, to the data comparison unit 185. The pattern information BPIF may be provided to the memory controller 200c of FIG. 23.

Figure 25:
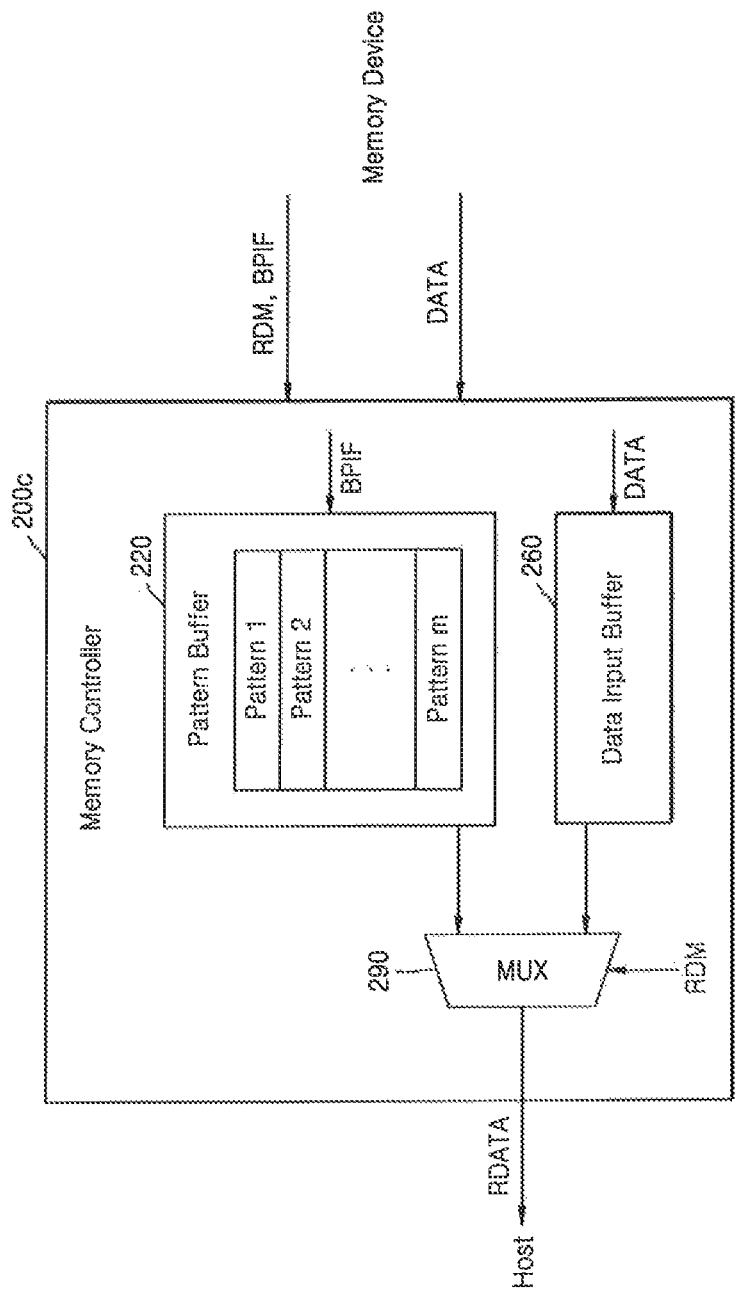
FIG. 25 is a schematic block diagram of a memory controller according to an exemplary embodiment of the inventive concept.

FIG. 25 is a schematic block diagram of the memory controller 200c according to an exemplary embodiment of the inventive concept. The memory controller 200c of FIG. 25 may be applied to the memory system 1000c of FIG. 23.

Referring to FIG. 25, the memory controller 200c includes the pattern buffer 220, a data input buffer 260, and a multiplexer 290.

The memory controller 200c may receive data DATA and a matching signal RDM from the memory device 100c. The memory controller 200c may also receive pattern information BPIF from the memory device 100c.

The data input buffer 260 may receive the data DATA from the memory device 100c. The received data may be transmitted as read data RDATA to a host via the multiplexer 290.

The pattern buffer 220 may store a plurality of data patterns Pattern 1 to Pattern m. The pattern buffer 220 may select one of the plurality of data patterns Pattern 1 to Pattern m based on the pattern information BPIF and output the selected data pattern. The output data pattern may be transmitted as the read data RDATA to the host via the multiplexer 290.

Based on the matching signal RDM, the multiplexer 290 may output one of the data provided from the data input buffer 260 and the data pattern provided from the pattern buffer 220 as the read data RDATA. The multiplexer 290 may output the data pattern in response to the matching signal RDM having the first level, and may output the data from the data input buffer 260 in response to the matching signal RDM having the second level.

Figure 26:
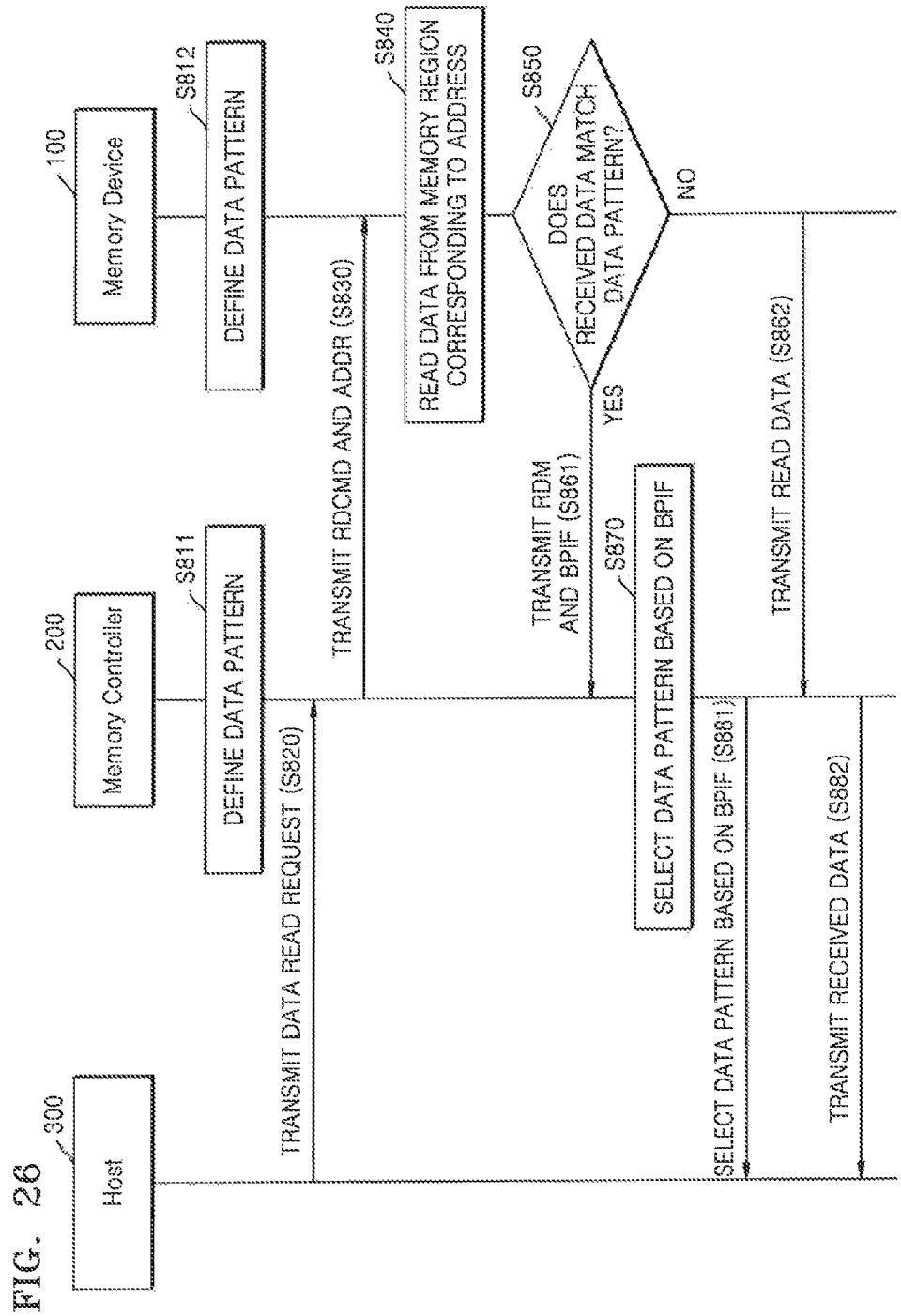
FIG. 26 is a flowchart of an operation method of an electronic device including a memory device, according to an exemplary embodiment of the inventive concept.

FIG. 26 is a flowchart of an operation method of an electronic device including a memory device, according to an exemplary embodiment of the inventive concept. FIG. 26 shows a read operation from among a plurality of normal operations of the electronic device. The electronic device may include the host 300, the memory controller 200, and the memory device 100. The memory controller 200 may correspond to the memory controller 200c described above with reference to FIGS. 23 and 25, and the memory device 100 may correspond to the memory device 100c described above with reference to FIGS. 23 and 24.

Referring to FIG. 26, the memory device 100 and the memory controller 200 define a data pattern (S811 and S812). The data pattern is data determined between the memory device 100 and the memory controller 200, and an identical data pattern may be defined in the memory controller 200 and the memory device 100.

When a data read request is received from the host 300 (S820), the memory controller 200 may transmit a read command RDCMD and an address signal ADDR to the memory device 100 (S830).

The memory device 100 may read data from a memory region corresponding to the address signal ADDR (S840). The memory device 100 may determine whether the read data matches a predefined data pattern (S850). The memory device 100 may compare the read data with the predefined data pattern and determine whether they match each other.

When the data matches the predefined data pattern, the memory device 100 may transmit a matching signal RDM and pattern information BPIF to the memory controller 200 (S861). When there are a plurality of predefined data patterns, the memory controller 200 may select one of the plurality of predefined data patterns based on the pattern information BPIF (S870), and transmit the selected data pattern as the read data to the host 300 (S881).

When the data does not match the predefined data pattern, the memory device 100 may transmit the read data to the memory controller 200 (S862), and the memory controller 200 may transmit the data, received from the memory device 100, as the read data to the host 300 (S882).

Figure 27:
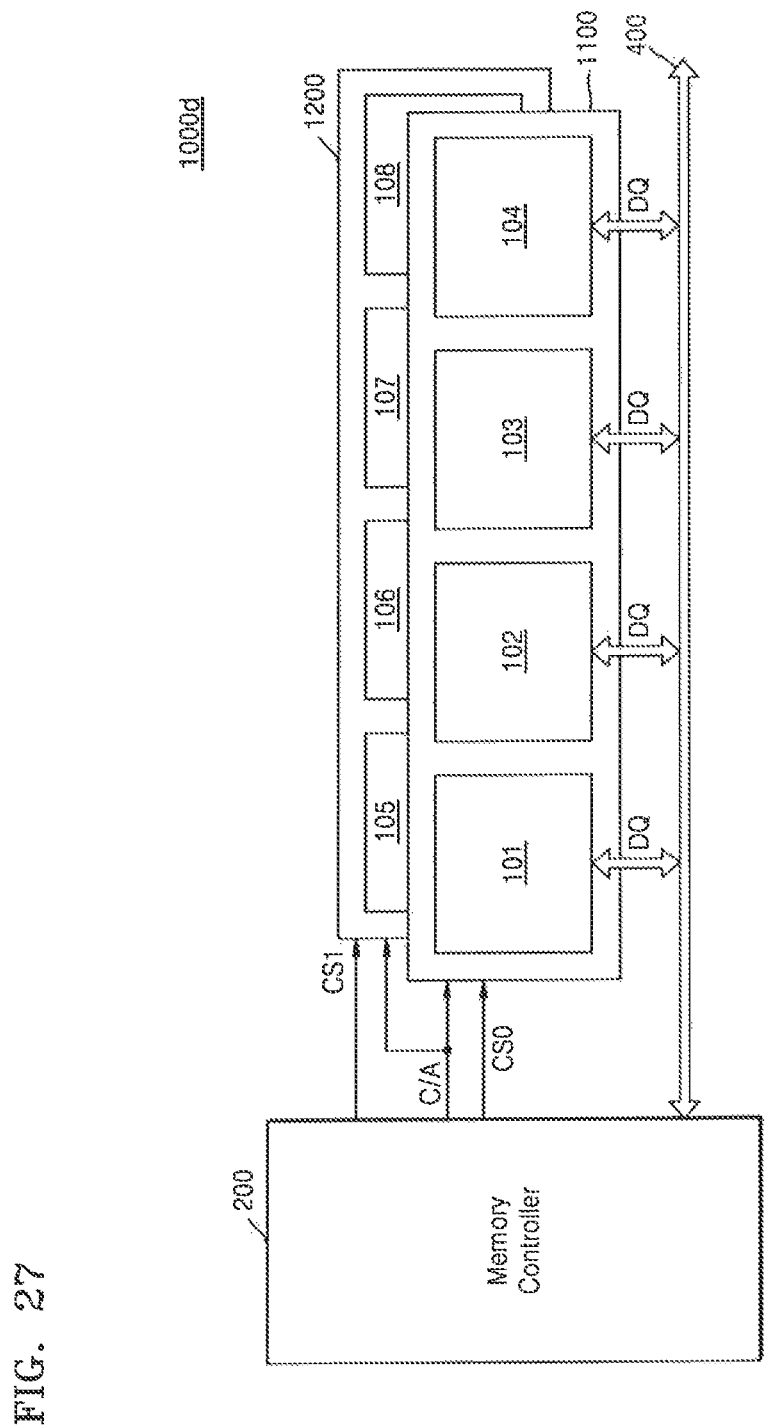
FIG. 27 is a block diagram of a memory system according to an exemplary embodiment of the inventive concept.
Figure 28:
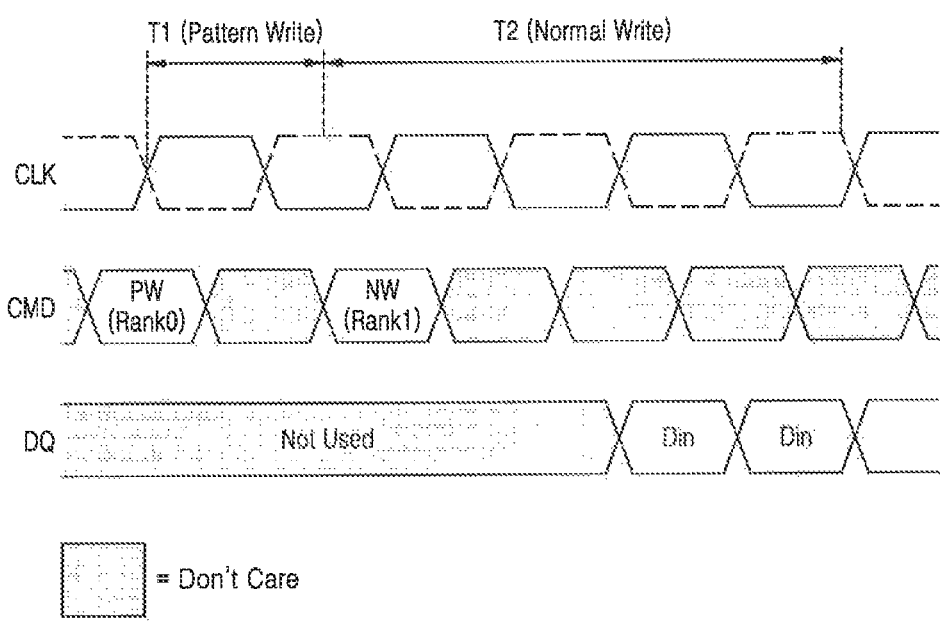
FIG. 28 is a timing diagram of an input signal applied to a rank of a memory system according to exemplary embodiments of the inventive concept.

FIG. 27 is a block diagram of a memory system according to an exemplary embodiment of the inventive concept. FIG. 28 is a timing diagram of an input signal applied to a rank of a memory system according to an exemplary embodiment of the inventive concept.

Referring to FIG. 27, a memory system 1000d includes first and second ranks 1100 and 1200 and the memory controller 200. The first and second ranks 1100 and 1200 may be provided on a single memory module. A rank may be defined as a memory device that simultaneously receives a command and an address signal, and is selected according to a chip select signal (CS). For example, in the memory module, the rank may be a group of DRAM chips selected according to the chip select signal (CS). The rank may be distinguished by using the chip select signal (CS) provided to the memory module.

The first rank 1100 may include first to fourth memory devices 101 to 104, and the second rank 1200 may include fifth to eighth memory devices 105 to 108. At least one of the first to eighth memory devices 101 to 108 may be provided as the memory device 100 or 100a according to the exemplary embodiments described above with reference to FIGS. 1 to 18.

A command/address signal C/A may be simultaneously input to the first to eighth memory devices 101 to 108 of the first and second ranks 1100 and 1200. In this case, the first to fourth memory devices 101 to 104 of the first rank 1100 may be selected based on a first chip select signal CS0, and the fifth to eighth memory devices 105 to 108 of the second rank 1200 may be selected based on a second chip select signal CS1. The first to eighth memory devices 101 to 108 of the first and second ranks 1100 and 1200 may be connected to a data bus 400 via the data pad (DQ).

The first and second ranks 1100 and 1200 share the data bus 400. When the first rank 1100 is using the data bus 400, the second rank 1200 cannot use the data bus 400. For example, when data is to be written to the first and second ranks 1100 and 1200, the memory controller 200 may transmit a write command and the data to the first rank 1100. After the data transmission is finished, e.g., after the first rank 1100 no longer occupies the data bus 400, the memory controller 200 may transmit a write command and the data to the second rank 1200. Accordingly, delay of data transmission due to the data bus 400 may affect operation speed of the memory system 1000d.

However, according to the operation methods of the memory devices and the memory systems described above with reference to FIGS. 1 to 26, because the first rank 1100 does not receive data from the memory controller 200 when receiving a pattern write command, the first rank 1100 does not use the data bus 400. Therefore, the memory controller 200 may transmit a write command (a pattern write command or a normal write command) to the second rank 1200 immediately after transmitting the pattern write command to the first rank 1100. The second rank 1200 may receive the data via the data bus 400. Similarly, after transmitting the pattern write command to the first rank 1100, the memory controller 200 may immediately transmit a read command to the second rank 1200, and receive read data from the second rank 1200 via the data bus 400. Accordingly, when the first rank 1100 operates in response to the pattern write command, the second rank 1200 may immediately operate thereafter in response to a write or read command.

Referring to FIG. 28, during a write operation, write commands, e.g., a pattern write command PW and a normal write command NW, are synchronized to a rising edge of a clock signal CLK and received. As shown in FIG. 28, data is not received when the pattern write command PW is received. Data (Din) may be received at a certain time after the normal write command NW is received. A time period for receiving the data (Din) may be relatively longer than a time period for receiving a command CMD.

As shown in FIG. 28, the first rank (Rank0) (e.g., the first rank 1100 of FIG. 27) may receive the pattern write command. A time period to receive the data (Din) is not required during a first time period T1 of the pattern write command PW. Therefore, after the first rank (Rank0) receives the pattern write command PW in response to the rising edge of the clock signal CLK, a write command for the second rank (Rank1) (e.g., the second rank 1200 of FIG. 27) may be synchronized to a following rising edge of the clock signal CLK and received. When the first rank (Rank0) operates according to the pattern write command PW, the second rank (Rank1) may immediately operate according to the normal write command NW. Thus, operation speed of the memory system 1000d of FIG. 27 may increase. Also, since there is no data transmission between the memory controller and the memory device when writing a data pattern, the data bus 400 is not used, thereby improving data bus utilization.

Figure 29A:
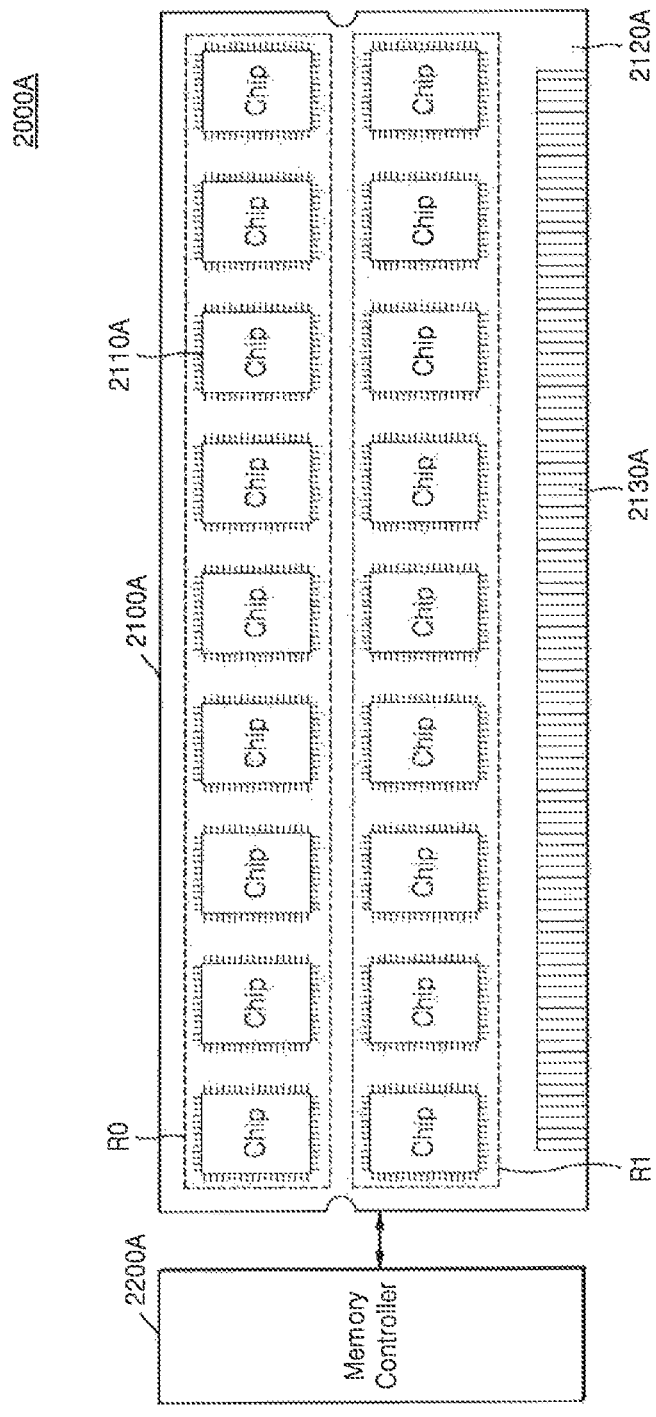
FIGS. 29A and 29B are block diagrams of a memory controller and a memory module, according to an exemplary embodiment of the inventive concept.
Figure 29B:
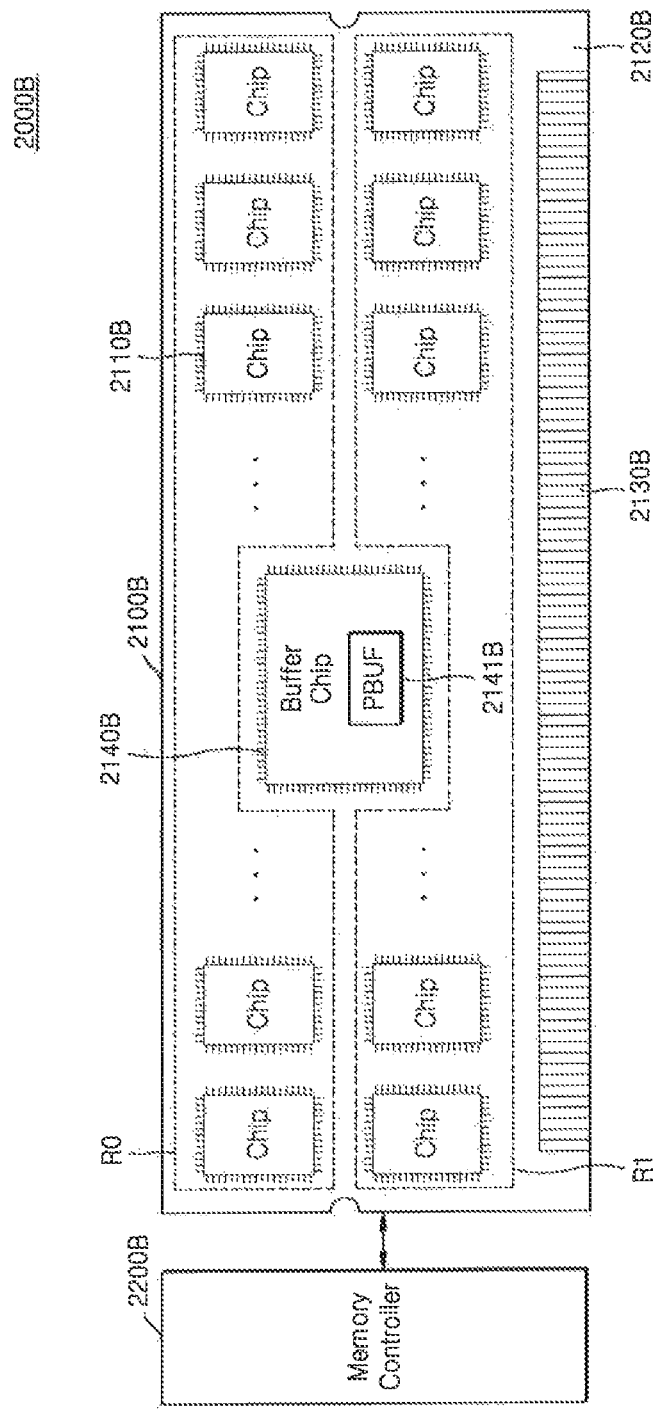

FIGS. 29A and 29B are block diagrams of a memory module 2100A and a memory controller 2200A, according to exemplary embodiments of the inventive concept.

Referring to FIG. 29A, a memory system 2000A includes the memory module 2100A and the memory controller 2200A. The memory module 2100A may include a printed circuit board 2120A, a plurality of memory chips 2110A, and a connector 2130A. The memory chips 2110A may be coupled to upper and lower surfaces of the printed circuit board 2120A. The connector 2130A may be electrically connected to the plurality of memory chips 2110A via conductive lines. Also, the connector 2130A may be connected to a slot of an external host. The memory module 2100A may be a dual in-line memory module (DIMM).

The memory chips 2110A may include volatile memory cells such as DRAM cells or non-volatile memory cells such as STT-MRAM cells. In this case, the memory chips 2110A may store data of a computer system for a short time or temporarily, such as operating memory cells, cache memory cells, or the like.

The memory chips 2110A may be arranged in two parallel rows in a lengthwise direction of the printed circuit board 2120A. The memory chips 2110A in a first row located relatively far from the connector 2130A may constitute a first rank R0, and the memory chips 2110A at a second row located relatively close to the connector 2130A may constitute a second rank R1.

The first rank R0 and the second rank R1 may be activated by different select signals.

The memory controller 2200A may queue or output commands. In the memory system 2000A, a DRAM interface may be configured between the memory controller 2200A and the memory module 2100A. According to an exemplary embodiment of the inventive concept, via the DRAM interface, when data to be stored in the memory chips 2110A matches a predefined data pattern, the memory controller 2200A may transmit a pattern write command and an address signal to one of the memory chips 2110A without transmitting the data. The memory chip 2110A, without receiving the data, internally generates a data pattern in response to the pattern write command and writes the generated data pattern to a memory cell array. The memory chips 2110A may include a pattern buffer for storing data patterns, and in response to the pattern write command, may write one of the data patterns stored in the patter buffer to the memory cell array.

Although FIG. 29A shows that the memory controller 2200A and the memory module 2100A are separately provided in the memory system 2000A, the memory controller 2200A may be included in the memory module 2100A. The memory controller 2200A may be coupled to an upper surface or a lower surface of the printed circuit board 2120A and communicate with the memory chips 2110A via conductive lines.

As shown in FIG. 29B, a memory system 2000B includes a memory module 2100B and a memory controller 2200B. The memory module 2100B may include at least one memory chip 2110B that includes a cell array, and a buffer chip 2140B for managing memory operations of the cell array. The memory module 2100B may further include a printed circuit board 2120B and a connector 2130B, which are similar to the printed circuit board 2120A and connector 2130A described above.

The buffer chip 2140B may receive a command, an address signal, and data from the memory controller 2200B, and provide the command and the data to a rank selected from among ranks R0 and R1. The buffer chip 2140B may include a pattern buffer 2141B. When a pattern write command is received from the memory controller 2200B, the buffer chip 2140B may output a data pattern, corresponding to the pattern write command, from the pattern buffer 2141B and provide the data pattern to memory chips 2110B included in the rank selected from among the ranks R0 and R1. When a normal write command is received from the memory controller 2200B, the buffer chip 2140B may provide data received from the memory controller 2200B to the memory chips 2110B included in the rank selected from among the ranks R0 and R1.

Although FIG. 29B shows that some functions of a memory controller are performed by a load reduced dual in-line memory module (LRDIMM) type memory module, the inventive concept is not limited thereto. For example, a fully buffered dual in-line memory module (FBDIMM) type memory module may be used and an advanced memory buffer (AMB) chip may be mounted as a management chip, e.g., an AMB (Advanced Memory Buffer) chip. Alternatively, other types of memory modules may be provided to perform at least some function of the aforementioned memory controller.

Figure 30:
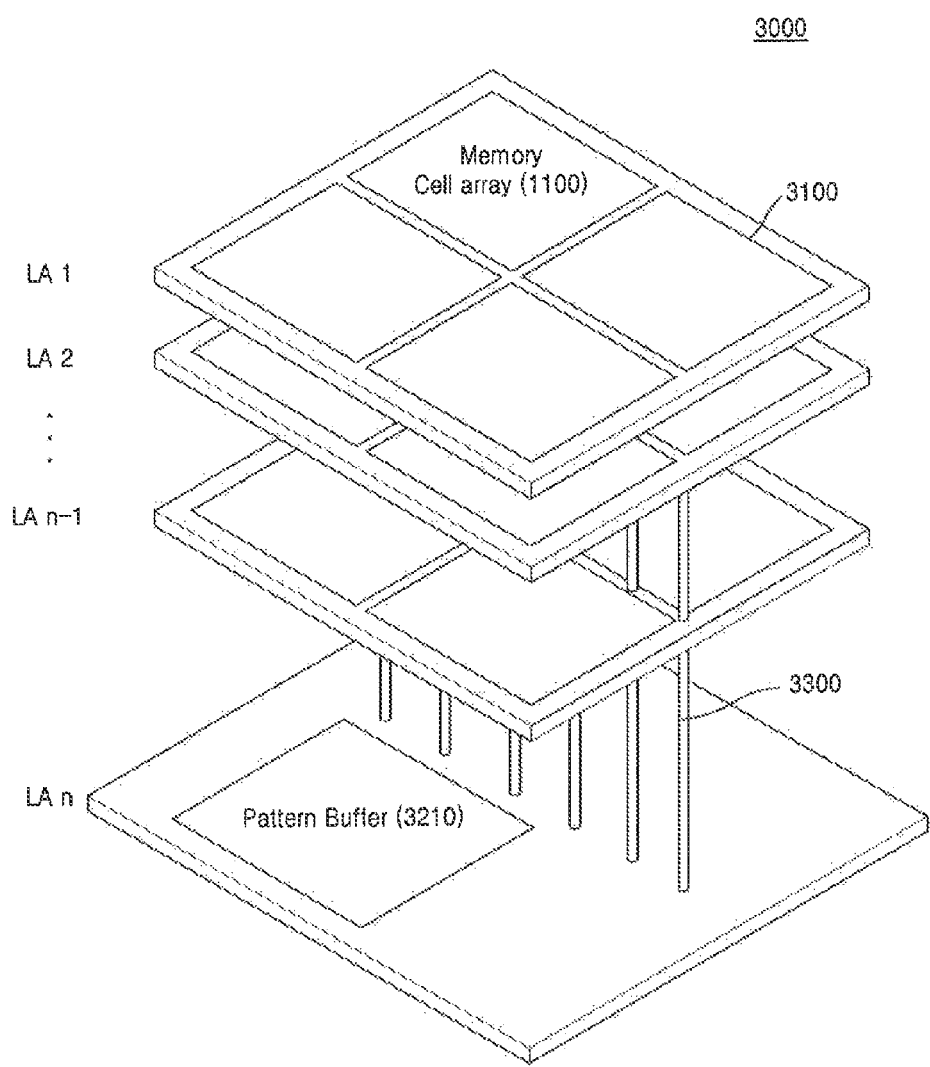
FIG. 30 is a block diagram of a memory device having a stack of a plurality of semiconductor layers according to an exemplary embodiment of the inventive concept.

FIG. 30 is a block diagram of a memory device 3000 having a stack of a plurality of semiconductor layers.

Referring to FIG. 30, the memory device 3000 includes a plurality of semiconductor layers LA1 to LAn. Each of the semiconductor layers LA1 to LAn may be a memory chip including a memory cell array 1100. Alternatively, some of the semiconductor layers LA1 to LAn may be memory chips and others of the semiconductor layers LA1 to LAn (or at least one of the semiconductor layers LA1 to LAn) may be controller chips that interface with the memory chips. In FIG. 30, it is assumed that the n-th semiconductor layer LAn is a controller chip.

The controller chip LAn may communicate with memory chips LA1 to LA n−1, and control operation modes of the memory chips LA1 to LA n−1. The controller chip LAn may control various functions, features, and modes by using mode registers of the memory chips LA1 to LA n−1. Also, the controller chip LAn may queue or output commands.

Also, the controller chip LAn may include a pattern buffer 3210. When a pattern write command is received from a memory controller, the controller chip LAn may output a data pattern corresponding to the pattern write command from the pattern buffer 3210 and provide the data pattern to the memory chips LA1 to LA n−1. When a normal write command is received from the memory controller, the controller chip LAn may provide data received from the memory controller to the memory chips LA1 to LA n−1.

The plurality of semiconductor layers LA1 to LAn that are stacked in the memory device 3000 may be connected to one another through a through-silicon via (TSV) 3300.

Figure 31:
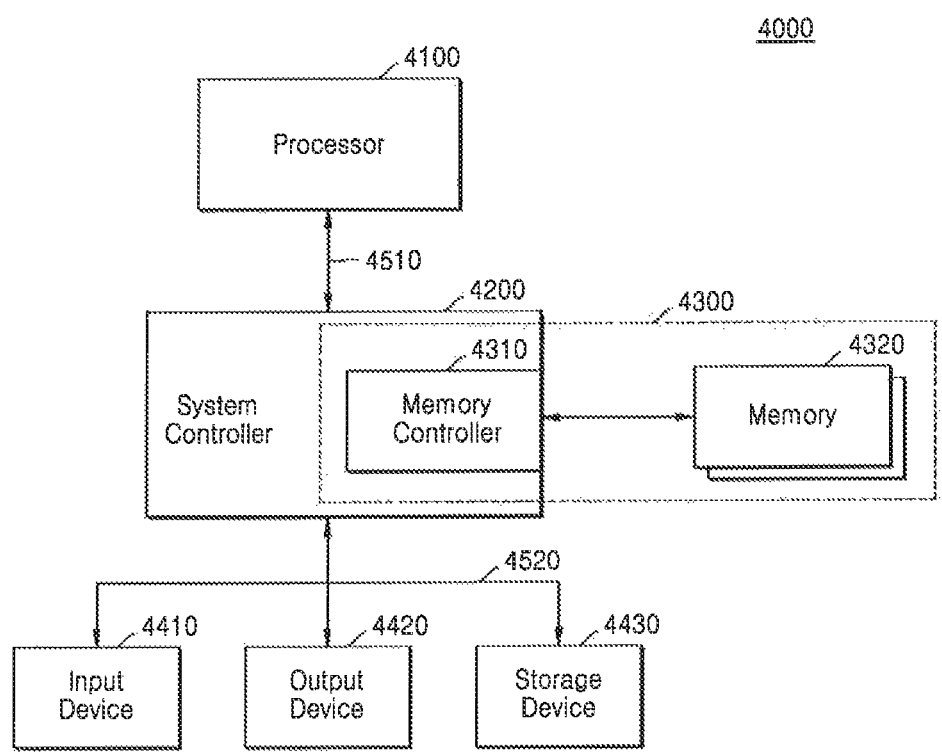
FIG. 31 is a block diagram of a computer system according to an exemplary embodiment of the inventive concept.

FIG. 31 is a block diagram of a computer system 4000 according to an exemplary embodiment of the inventive concept.

The computer system 4000 may be a desktop computer, a laptop computer, a workstation, a hand-held device, a wearable device, or the like. Referring to FIG. 31, the computer system 4000 includes a processor 4100, a system controller 4200, and a memory system 4300. The computer system 4000 may further include a processor bus 4510, an expansion bus 4520, an input device 4410, an output device 4420, and a storage device 4430. The memory system 4300 may include at least one memory device 4320 and a memory controller 4310. The memory controller 4310 may be included in the system controller 4200.

The processor 4100 may execute various computing operations such as executing software that performs calculations or tasks. For example, the processor 4100 may be a microprocessor or a central processing unit (CPU). The processor 4100 may be connected to the system controller 4200 via the processor bus 4510 that includes an address bus, a control bus, and/or a data bus. The system controller 4200 may be connected to the expansion bus 4520 that may include a peripheral component interconnection (PCI) bus. Accordingly, through the expansion bus 4520, the processor 4100 may control at least one input device 4410 such as a keyboard or a mouse, at least one output device 4420 such as a printer or a display device, and/or at least one storage device 4430 such as a hard disk drive, a solid state drive, or a CD-ROM.

The memory controller 4310 may control the memory device 4320 such that the memory device 4320 performs commands provided by the processor 4100. The memory device 4320 may store data provided from the memory controller 4310, and provide the stored data to the memory controller 4310. The memory device 4320 may include a plurality of volatile memory chips (e.g., DRAM, static random-access memory (SRAM), or the like) or non-volatile memory chips.

According to an exemplary embodiment of the inventive concept, when write data, provided with a write command from the processor 4100, matches a predefined data pattern, the memory controller 4310 may transmit a pattern write command without transmitting data to the memory device 4320. The memory device 4320 may write the predefined data pattern to a memory cell array so as to store the write data requested to be written by the processor 4100. Therefore, since data transmission between the memory controller 4310 and the memory device 4320 may be reduced, power consumption of the computer system 4000 may be reduced and operation speed of the computer system 4000 may be improved.

Figure 32:
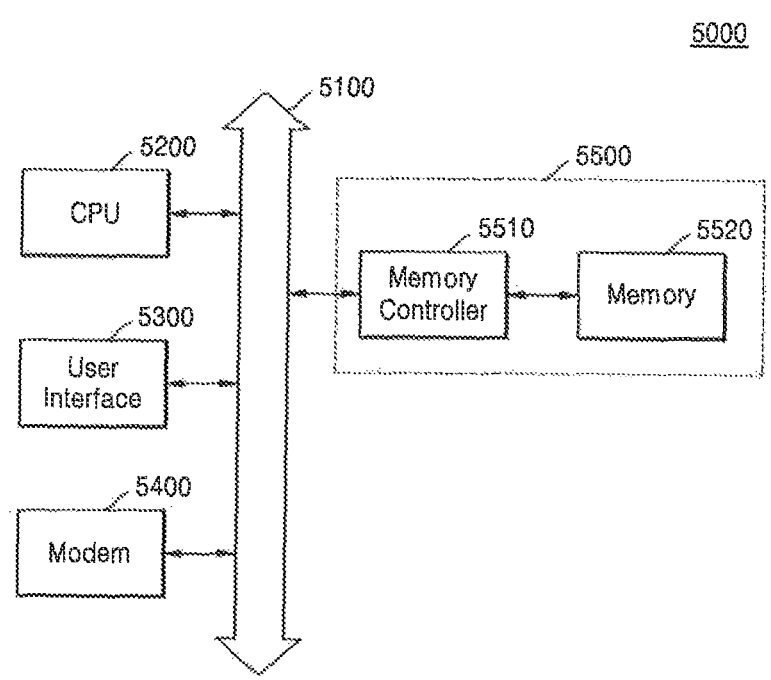
FIG. 32 is a block diagram of a computer system including a memory system, according to an exemplary embodiment of the inventive concept.

FIG. 32 is a block diagram of a computer system 5000 including a memory system 5500, according to an exemplary embodiment of the inventive concept. Referring to FIG. 32, the computer system 5000 includes a CPU 5200, a user interface 5300, a modem 5400, and the memory system 5500 electrically connected to a system bus 5100. A memory device 5520 may include volatile memory cells such as DRAM cells or non-volatile memory cells such as STT-MRAM cells.

The memory system 5500 may include the memory device 5520 and a memory controller 5510. The memory device 5520 may store data processed by the CPU 5200 or data input from an external source. The memory device 5520 may be used as storage for storing a large amount of data necessary for the computer system 5000 or as a main memory device for storing data such as system data that need to be accessed quickly.

According to an exemplary embodiment of the inventive concept, when data input by the CPU 5200 or the external source matches a predefined data pattern, the memory system 5500 may store the data in the memory device 5520 without data transmission between the memory controller 5510 and the memory device 5520. The memory controller 5510 may transmit a pattern write command that instructs the predefined data pattern to be written to the memory device 5520. The memory device 5520 may internally generate a data pattern in response to the pattern write command and store the generated data pattern so as to store the data input by the CPU 5200 or the external source. Since data transmission between the memory controller 5510 and the memory device 5520 may be reduced, power consumption of the computer system 5000 may be reduced and operation speed of the computer system 5000 may be improved.

Although not illustrated, the computer system 5000 may further include an application chipset, a camera image processor (CIS), an input/output device, or the like.

While the inventive concept has been shown and described with reference to exemplary embodiments thereof, it will be understood to those of ordinary skill in the art that various changes in form and details may be made thereto without departing from the spirit and scope of present inventive concept as defined by the following claims.

What is claimed is:

1. A memory device comprising:
   a memory cell array including a first memory bank and a second memory bank, each of the first and the second memory banks being accessible independently;
   a write circuit configured to perform a pattern write operation upon receiving a pattern write command and a first address, and to perform a normal write operation upon receiving a normal write command, a second address and a write data;
   a data pattern providing unit configured to provide a selected data pattern to the write circuit in response to the pattern write command, the selected data pattern being a data pattern to be written into the memory cell array; and
   a data input buffer configured to receive the write data from an external device and to provide the write data to the write circuit during the normal write operation;
   wherein, during the pattern write operation, the selected data pattern is written into the first memory bank designated by the first address and, during the normal write operation, the write data received from the external device is written into the second memory bank designated by the second address, and
   wherein at least a portion of the normal write operation in the second memory bank is performed in parallel with the pattern write operation in the first memory bank.

2. The memory device of claim 1, wherein the memory device is a dynamic random access memory (DRAM).

3. The memory device of claim 2, wherein the write data is received through DQ pins of the memory device for the normal write operation, and the write data is not received for the pattern write operation.

4. The memory device of claim 3, wherein the write data is received after a predetermined delay from the normal write command.

5. The memory device of claim 4, wherein the data pattern providing unit includes a pattern buffer for storing a plurality of data patterns and generates the selected data pattern based on the plurality of data patterns stored in the pattern buffer.

6. The memory device of claim 5, wherein the DRAM receives write command related signals for performing the pattern write operation and the normal write operation, and the signals are a chip select signal (/CS), a row address strobe signal (/RAS), a column address strobe signal (/CAS), and a write enable signal (/WE), and their logic levels are low, high, low, and low respectively, and the DRAM further receives a mode signal from the external device, and the mode signal identifies whether the received write command is the pattern write command or the normal write command.

7. The memory device of claim 6, wherein the mode signal further identifies the selected data pattern among the plurality of data patterns.

8. The memory device of claim 7, wherein the mode signal is received through at least three address pins which are not used for transmitting address signals.

9. The memory device of claim 8, wherein the memory device further receives a pattern store command along with a buffer data, and the buffer data is stored in the pattern buffer as one of the plurality of data patterns.

10. The memory device of claim 9, wherein the plurality of data patterns include a user-defined data pattern and/or a data pattern that is frequently written to the memory device.

11. The memory device of claim 10, wherein the plurality of data patterns include a data pattern whose logic levels are all low and/or a data pattern whose logic levels are all high.

12. The memory device of claim 10, wherein the pattern write command and the normal write command are received in synchronous with a first rising edge of a clock signal and a second rising edge of the clock signal respectively, and the second rising edge of the clock signal follows immediately after the first rising edge.

13. A memory device including a plurality of semiconductor layers comprising:
a plurality of memory chips, each memory chip comprising:
a memory cell array including a first memory bank and a second memory bank, each of the first and the second memory banks being accessible independently; and
a write circuit configured to perform a pattern write operation upon receiving a pattern write command and a first address, and to perform a normal write operation upon receiving a normal write command, a second address and a write data; and
a controller chip comprising:
a data pattern providing unit configured to provide a selected data pattern to the write circuit in response to the pattern write command, the selected data pattern being a data pattern to be written into the memory cell array; and
a data input buffer configured to receive the write data from an external device and provide the write data to the write circuit during the normal write operation;
wherein, during the pattern write operation, the selected data pattern is written into the first memory bank designated by the first address and, during the normal write operation, the write data received from the external device is written into the second memory bank designated by the second address, and
wherein the plurality of memory chips are stacked on the controller chip and connected to the controller chip through a through-silicon via (TSV).

14. The memory device of claim 13, wherein the memory device is a dynamic random access memory (DRAM).

15. The memory device of claim 14, wherein at least a portion of the normal write operation in the second memory bank is performed in parallel with the pattern write operation in the first memory bank.

16. The memory device of claim 15, wherein the write data is received through DQ pins of the memory device for the normal write operation, and the write data is not received for the pattern write operation.

17. The memory device of claim 16, wherein the data pattern providing unit includes a pattern buffer for storing a plurality of data patterns and generates the selected data pattern based on the plurality of data patterns stored in the pattern buffer.

18. The memory device of claim 17, wherein the DRAM receives write command related signals for performing the pattern write operation and the normal write operation, and the signals are a chip select signal (/CS), a row address strobe signal (/RAS), a column address strobe signal (/CAS), and a write enable signal (/WE), and their logic levels are low, high, low, and low respectively, and the DRAM further receives a mode signal from the external device, and the mode signal identifies whether the received write command is the pattern write command or the normal write command.

19. The memory device of claim 18, wherein the mode signal further identifies the selected data pattern among the plurality of data patterns.

20. The memory device of claim 19, wherein the mode signal is received through address pins which are not used for transmitting address signals.

21. The memory device of claim 20, wherein the memory device further receives a pattern store command along with a buffer data, and the buffer data is stored in the pattern buffer as one of the plurality of data patterns.

22. The memory device of claim 21, wherein the pattern write command and the normal write command are received in synchronous with a first rising edge of a clock signal and a second rising edge of the clock signal respectively, and the second rising edge of the clock signal follows immediately after the first rising edge.

23. A memory controller comprising:
a pattern buffer configured to store a data pattern;
a receiver circuit configured to receive a write request, address information and a data from a host;
a data comparison unit configured to compare the data with the data pattern stored in the data pattern buffer; and
a control logic configured to generate one of a pattern write command and a normal write command based on the comparison result,
wherein, if the comparison result matched, the control logic transmits the pattern write command and a first address to a memory device, if the comparison result not matched, the control logic transmits the normal write command, a second address and write data to the memory device.

24. The memory controller of claim 23, wherein the pattern write command includes a mode signal which indicates the data pattern matched with the data received from the host.

25. The memory controller of claim 24, wherein the mode signal identifies a data pattern stored in the memory device in response to the pattern write command, the stored data pattern in the memory device is same with the data pattern matched with the data received from the host.

26. The memory controller of claim 25, wherein the memory controller further transmits a pattern store command along with the data pattern for storing the data pattern in the memory device.

27. The memory controller of claim 26, wherein the pattern write command and the normal write command are transmitted in synchronous with a first rising edge of a clock signal and a second rising edge of the clock signal respectively, and the second rising edge of the clock signal follows immediately after the first rising edge.

* * * * *